US010707216B2

(12) United States Patent
Yoon et al.

(10) Patent No.: US 10,707,216 B2
(45) Date of Patent: Jul. 7, 2020

(54) SEMICONDUCTOR DEVICE AND METHOD FOR MANUFACTURING THE SAME

(71) Applicant: SAMSUNG ELECTRONICS CO., LTD., Suwon-si (KR)

(72) Inventors: Sungmi Yoon, Seoul (KR); Chunhyung Chung, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/023,018

(22) Filed: Jun. 29, 2018

(65) Prior Publication Data
US 2019/0296025 A1    Sep. 26, 2019

(30) Foreign Application Priority Data

Mar. 20, 2018 (KR) ........................ 10-2018-0032063

(51) Int. Cl.
*H01L 21/336* (2006.01)
*H01L 27/108* (2006.01)
(Continued)

(52) U.S. Cl.
CPC .... *H01L 27/10876* (2013.01); *C23C 16/0209* (2013.01); *C23C 16/24* (2013.01);
(Continued)

(58) Field of Classification Search
CPC ......... H01L 27/10876; H01L 27/10814; H01L 27/10823; H01L 21/32055; H01L 21/76235
See application file for complete search history.

(56) References Cited

U.S. PATENT DOCUMENTS 7,521,360 B2    4/2009  Halahan et al.
7,682,924 B2    3/2010  Bhat et al.
(Continued)

FOREIGN PATENT DOCUMENTS

KR   10-2005-0002007 A    1/2005
KR   10-2006-0000485 A    1/2006

OTHER PUBLICATIONS

Communication dated Aug. 27, 2019 issued by the European Intellectual Property Office in counterpart European Application No. 18213006.2.

*Primary Examiner* — Didarul A Mazumder
*Assistant Examiner* — Wasiul Haider
(74) *Attorney, Agent, or Firm* — Sughrue Mion, PLLC

(57) ABSTRACT

Provided is a method for manufacturing a semiconductor device including: patterning a substrate to form a plurality of active patterns including two adjacent active patterns having a first trench therebetween; forming a semiconductor layer on the plurality of active patterns to cover the plurality of active patterns; forming a device isolation layer on the semiconductor layer to cover the semiconductor layer for oxidization and fill the first trench; patterning the device isolation layer and the plurality of active patterns so that a second trench intersecting the first trench is formed and the two active patterns protrudes from the device isolation layer in the second trench; and forming a gate electrode in the second trench. Here, a first thickness of the semiconductor layer covering a top surface of each of the two active patterns is greater than a second thickness of the semiconductor layer covering a bottom of the first trench.

20 Claims, 35 Drawing Sheets

(51) Int. Cl.
*H01L 21/762* (2006.01)
*H01L 21/3205* (2006.01)
*H01L 21/321* (2006.01)
*C23C 16/24* (2006.01)
*H01L 29/06* (2006.01)
*C23C 16/44* (2006.01)
*C23C 16/02* (2006.01)

(52) U.S. Cl.
CPC ........ *C23C 16/44* (2013.01); *H01L 21/32055* (2013.01); *H01L 21/32105* (2013.01); *H01L 21/76235* (2013.01); *H01L 27/10814* (2013.01); *H01L 27/10823* (2013.01); *H01L 29/0649* (2013.01)

(56) References Cited

U.S. PATENT DOCUMENTS

| | | | |
|---|---|---|---|
| 8,058,138 B2 | 11/2011 | McGinnis et al. | |
| 8,476,168 B2 | 7/2013 | Graves-Abe et al. | |
| 9,257,305 B2 | 2/2016 | Lee | |
| 9,464,348 B2 | 10/2016 | Arora et al. | |
| 9,607,883 B2 | 3/2017 | Chiu | |
| 2006/0003546 A1 | 1/2006 | Klipp et al. | |
| 2007/0020855 A1 | 1/2007 | Kim et al. | |
| 2007/0128868 A1 | 6/2007 | Halahan et al. | |
| 2009/0047769 A1 | 2/2009 | Bhat et al. | |
| 2010/0015813 A1 | 1/2010 | McGinnis et al. | |
| 2010/0117048 A1 | 5/2010 | Lung et al. | |
| 2012/0164842 A1 | 6/2012 | Watanabe et al. | |
| 2012/0190204 A1 | 7/2012 | Graves-Abe et al. | |
| 2013/0164907 A1 | 6/2013 | Lee | |
| 2015/0137251 A1* | 5/2015 | Lee | H01L 21/76224 257/368 |
| 2015/0325469 A1 | 11/2015 | Chiu | |
| 2016/0064026 A1 | 3/2016 | Arora et al. | |

* cited by examiner

SEMICONDUCTOR DEVICE AND METHOD FOR MANUFACTURING THE SAME

CROSS-REFERENCE TO THE RELATED APPLICATION

This application claims priority from Korean Patent Application No. 10-2018-0032063, filed on Mar. 20, 2018, in the Korean Intellectual Property Office, the disclosure of which is incorporated herein by reference in its entirety.

BACKGROUND

1. Field

Methods and apparatuses consistent with the example embodiments of the inventive concepts relate to a semiconductor device, more particularly, to a semiconductor device including a data storage element and a method for manufacturing the same.

2. Description of the Related Art

Semiconductor devices are widely used in an electronic industry because of their small sizes, multi-functional characteristics, and/or low manufacture costs. Data storage devices among the semiconductor devices may store logical data. The data storage devices have been highly integrated with the development of the electronic industry. Thus, the size of elements or components of the data storage devices has been reduced.

In addition, high reliability of the data storage devices is required with the high integration of the data storage devices. However, the reliability of the data storage devices may be deteriorated by the high integration. Thus, various researches have been carried out to improve the reliability of the data storage devices.

SUMMARY

Example embodiments of the inventive concepts provide a semiconductor device with improved electrical characteristics.

Example embodiments of the inventive concepts also provide a method for manufacturing a semiconductor device with improved electrical characteristics.

According to example embodiments, there is provided a method for manufacturing a semiconductor device which may include: patterning a semiconductor substrate to form a plurality of active patterns including two active patterns arranged in a first direction to be adjacent to each other and having a first trench therebetween; forming a semiconductor layer on the plurality of active patterns so that the semiconductor layer covers the plurality of active patterns; forming a device isolation layer on the semiconductor layer so that the device isolation layer covers the semiconductor layer, fills the first trench covered by the semiconductor layer, and the semiconductor layer is oxidized; patterning the device isolation layer and the plurality of active patterns so that a second trench intersecting the first trench is formed and the two active patterns protrudes from the device isolation layer in the second trench; and forming a gate electrode in the second trench. Here, the forming the semiconductor layer on the plurality of active patterns is performed such that a first thickness of the semiconductor layer covering a top surface of each of the two active patterns is greater than a second thickness of the semiconductor layer covering a bottom of the first trench.

According to example embodiments there is provided a method for manufacturing a semiconductor device which may include: patterning a semiconductor substrate to form a plurality of active patterns and a first trench between two active patterns adjacent to each other and arranged in a first direction; forming a semiconductor layer on the plurality of active patterns to cover the plurality of active patterns such that a thickness of the semiconductor layer along an outer surface of each of the two active patterns diminishes in a downward direction from a top portion toward a bottom portion of each of the two active patterns; forming a device isolation layer on the semiconductor layer to cover the semiconductor layer and the plurality of active patterns, fill the first trench, and oxidize at least the semiconductor layer; patterning the device isolation layer and the plurality of active patterns to form a second trench intersecting the first trench, and provide the two active patterns protruding from the device isolation layer in the second trench; and forming gate electrode in the second trench. Here, after the oxidizing the at least the semiconductor layer, substantially all of the semiconductor layer is oxidized at least at a lower part of each of the two active patterns so that a space for a portion of the gate electrode to be filled between the two active patterns is provided in the first trench after the patterning the device isolation layer and the plurality of active patterns.

According to example embodiments, there is provided a semiconductor device which may include: a substrate on which at least two active patterns adjacent to each other in a first direction are formed: a device isolation layer, including a semiconductor oxidation layer, formed on the substrate to provide two channel regions of the semiconductor device by exposing the two active patterns and a first trench therebetween on the substrate; and a gate electrode formed on the two active patterns and filling the first trench. Here, the two active patterns disposed below the gate electrode are protruded from the device isolation layer to form the two channel regions, and a width of each of the two active patterns is narrower at an upper portion surrounded by the gate electrode than a lower portion surrounded by the device isolation layer.

BRIEF DESCRIPTION OF THE DRAWINGS

The inventive concepts will become more apparent in view of the attached drawings and accompanying detailed description.

DETAILED DESCRIPTION OF THE EXAMPLE EMBODIMENTS

Figure 1:
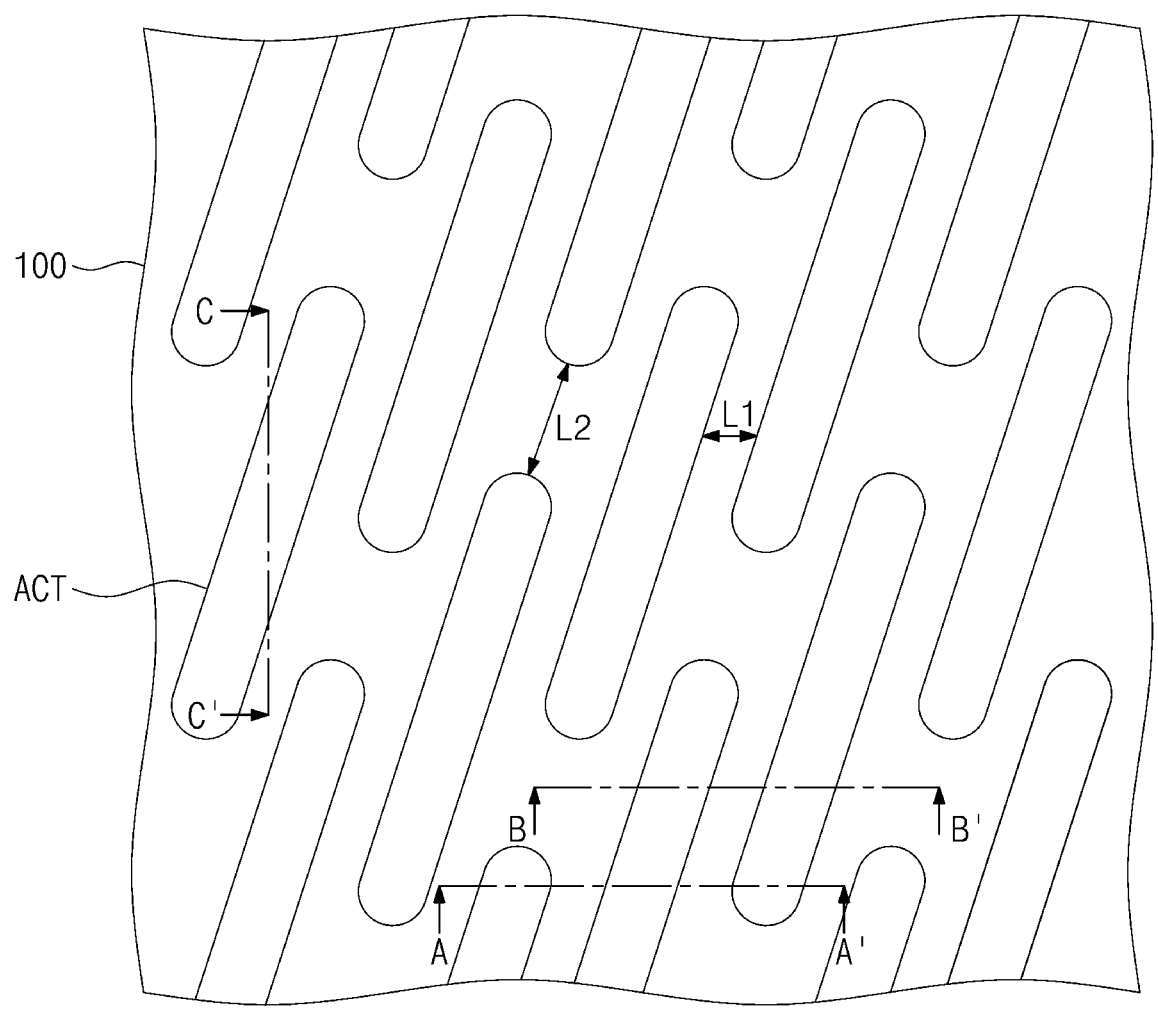
FIGS. 1, 3, 5, 7, 9, 11, 13 and 15 are plan views illustrating a method for manufacturing a semiconductor device according to example embodiments.
Figure 2A:
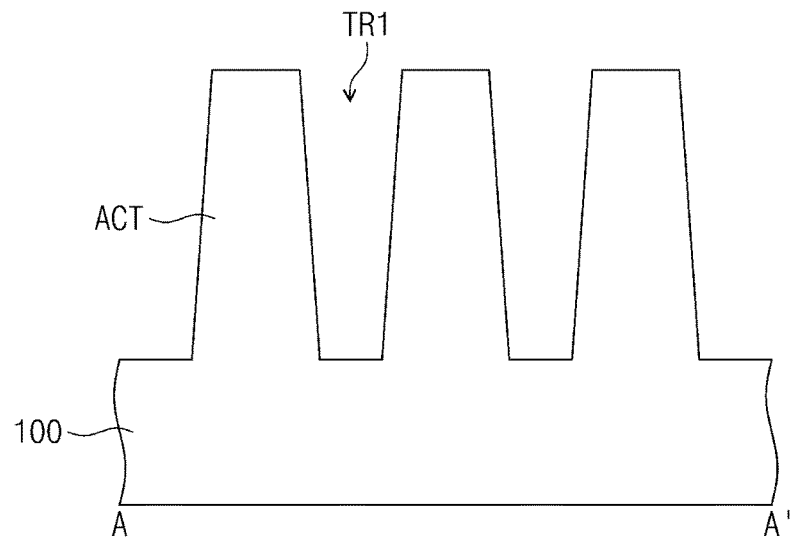
FIGS. 2A, 4A, 6A, 8A, 10A, 12A, 14A and 16A are cross-sectional views taken along lines A-A' of FIGS. 1, 3, 5, 7, 9, 11, 13 and 15, respectively.
Figure 2A:
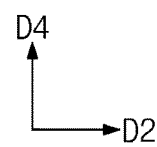
Figure 2B:
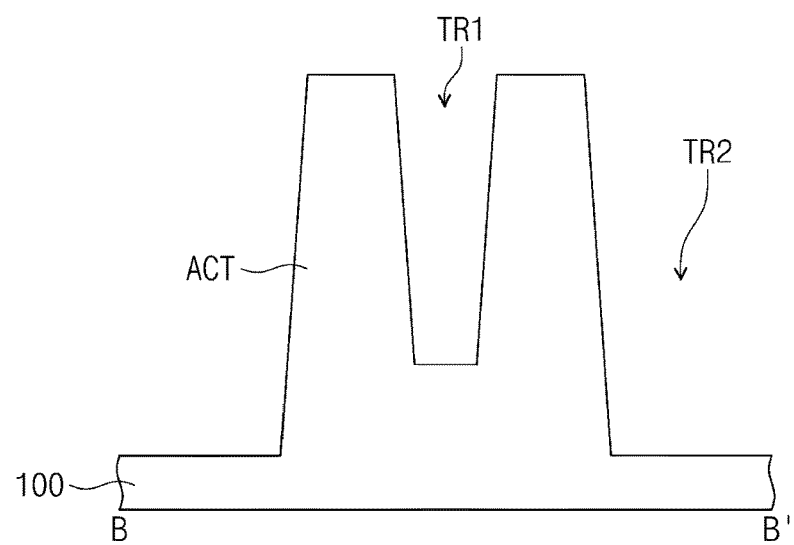
FIGS. 2B, 4B, 6B, 8B, 10B, 12B, 14B and 16B are cross-sectional views taken along lines B-B' of FIGS. 1, 3, 5, 7, 9, 11, 13 and 15, respectively.
Figure 2B:
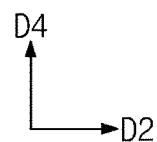
Figure 2C:
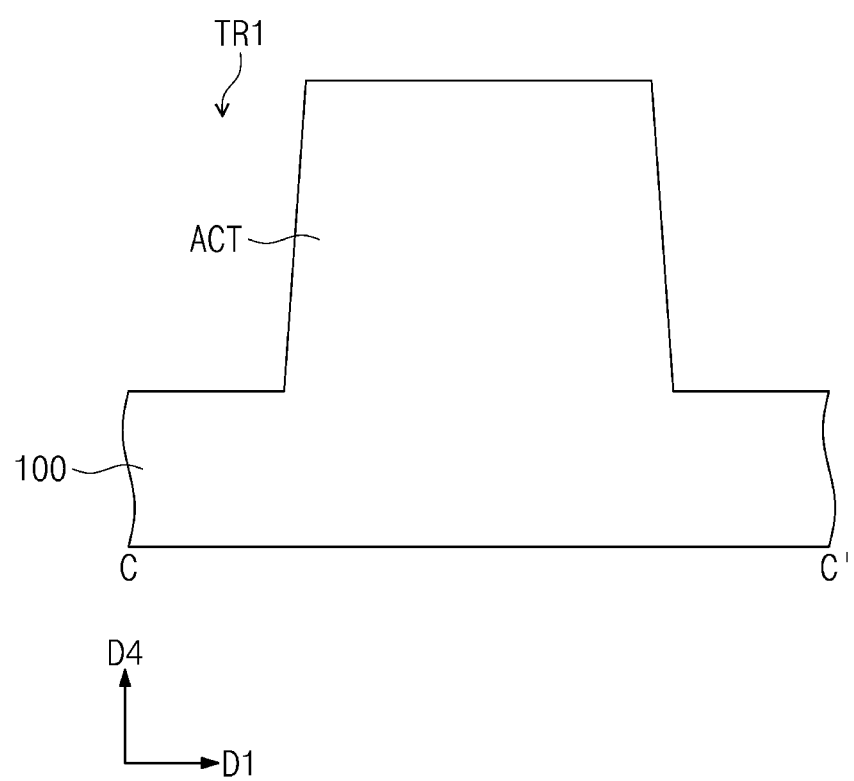
FIGS. 2C, 4C, 6C, 8C, 10C, 12C, 14C and 16C are cross-sectional views taken along lines C-C' of FIGS. 1, 3, 5, 7, 9, 11, 13 and 15, respectively.
Figure 3:
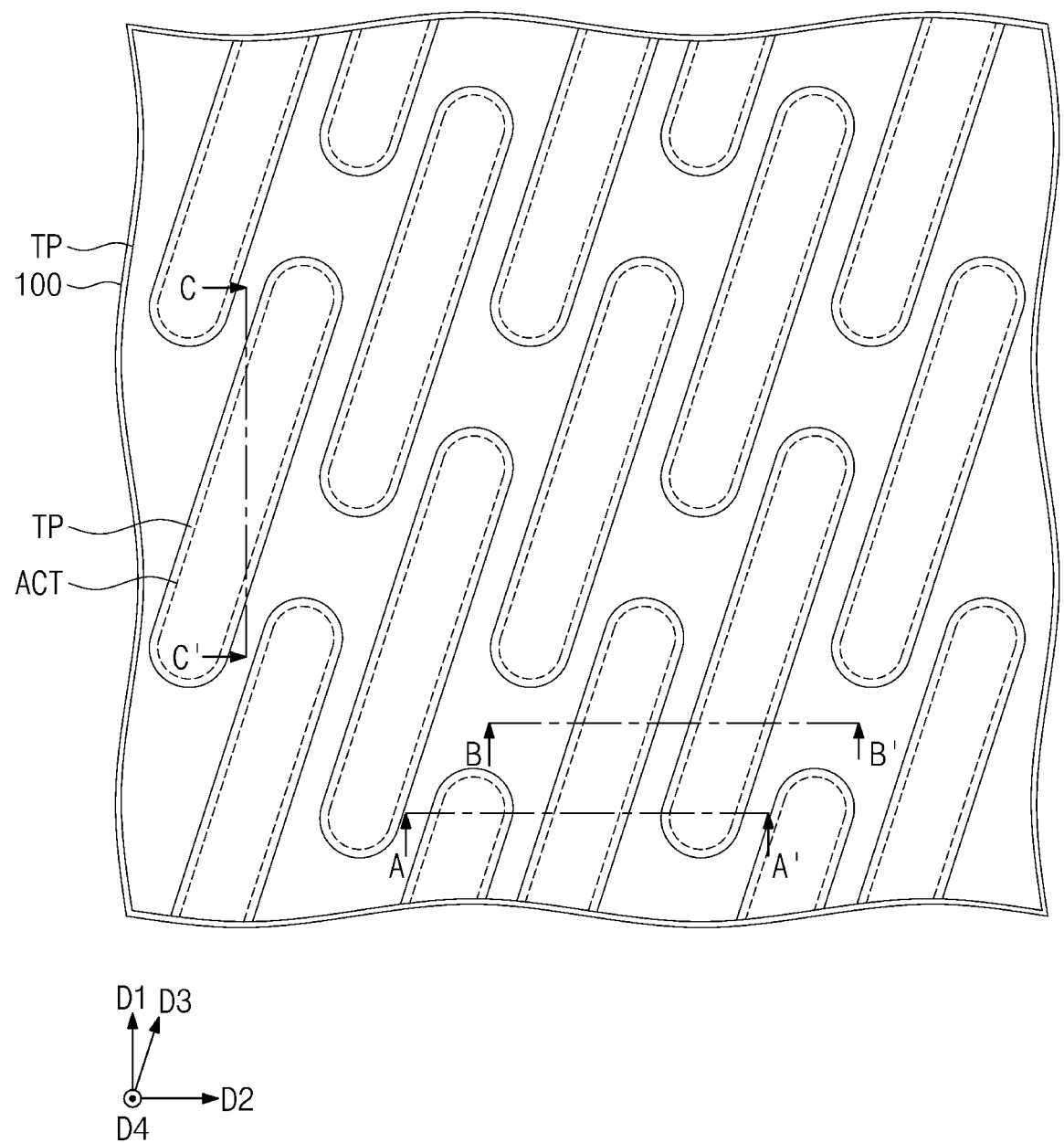
Figure 4A:
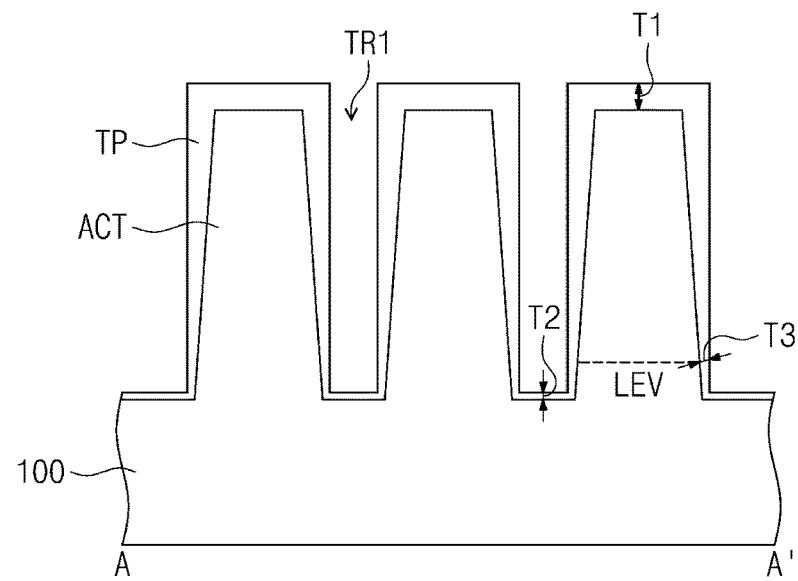
Figure 4B:
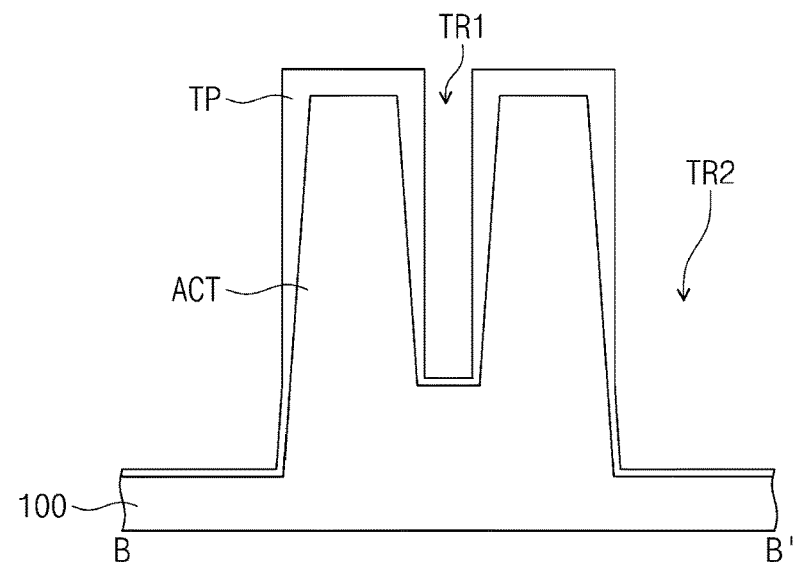
Figure 4C:
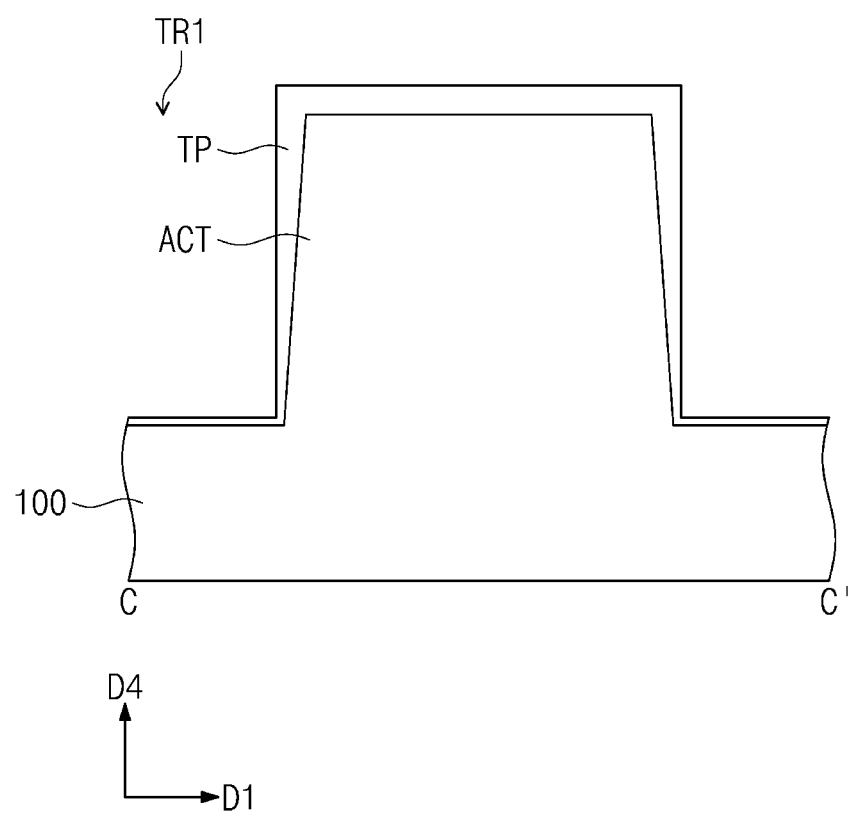

Various example embodiments of the inventive concepts will be described more fully hereinafter with reference to the accompanying drawings. The inventive concepts may, however, be embodied in many different forms and should not be construed as limited to the embodiments set forth herein. Rather, these embodiments are provided so that this description will be thorough and complete, and will fully convey the scope of the inventive concepts to those skilled in the art. In the drawings, the sizes and relative sizes of layers and regions may be exaggerated for clarity.

It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. Like numerals refer to like elements throughout. As used herein, the term "and/or" includes any and all combinations of one or more of the associated listed items.

The terms "first," "second," "third," etc. are used only to distinguish the different components or elements such as "trenches" or "directions" described herein, not being limited thereto, from one another. For example, "a third trench TR3" described in the embodiments could be termed "a second trench" in the claims of the present application when the claim needs to represent the third trench TR3 but the term "a second trench" has not been used in the claim after the term "a first trench." Likewise, "a second trench TR2" described in the embodiments could be termed "a third trench" in the claims when the term "a second trench" has already been used in the claims to indicate another trench. Likewise, "a second direction D2" described in the embodiments could be termed "a first direction" in the claims as necessary.

FIGS. 1, 3, 5, 7, 9, 11, 13 and 15 are plan views illustrating a method for manufacturing a semiconductor device according to example embodiments of the inventive concepts. FIGS. 2A, 4A, 6A, 8A, 10A, 12A, 14A and 16A are cross-sectional views taken along lines A-A' of FIGS. 1, 3, 5, 7, 9, 11, 13 and 15, respectively. FIGS. 2B, 4B, 6B, 8B, 10B, 12B, 14B and 16B are cross-sectional views taken along lines B-B' of FIGS. 1, 3, 5, 7, 9, 11, 13 and 15, respectively. FIGS. 2C, 4C, 6C, 8C, 10C, 12C, 14C and 16C are cross-sectional views taken along lines C-C' of FIGS. 1, 3, 5, 7, 9, 11, 13 and 15, respectively.

Referring to FIGS. 1 and 2A to 2C, an upper portion of a substrate 100 may be patterned to form active patterns ACT. For example, the substrate 100 may be a semiconductor substrate including silicon, germanium, or silicon-germanium. Each of the active patterns ACT may extend in a third direction D3 parallel to a top surface of the substrate 100 where the active patterns are not formed. Some of the active patterns ACT may be spaced apart from each other in the third direction D3. Each of the active patterns ACT may have a width which becomes progressively decreased in an upward direction (i.e., a fourth direction D4) from the top surface of the substrate 100 where the active patterns are not formed. The width of each of the active patterns ACT may decrease as a distance from a bottom surface of the substrate 100 increases.

First and second trenches TR1 and TR2 may be defined between the active patterns ACT. The first trench TR1 may be defined between two active patterns ACT adjacent to each other in a second direction D2. The second trench TR2 may be defined between two active patterns ACT adjacent to each other in the third direction D3.

A distance between the two active patterns ACT adjacent to each other in the second direction D2 may be a first distance L1. A distance between the two active patterns ACT adjacent to each other in the third direction D3 may be a second distance L2. The second distance L2 may be greater than the first distance L1. Thus, the second trench TR2 may be deeper than the first trench TR1 with respect to top surfaces of the active patterns ACT. In other words, a bottom of the second trench TR2 may be lower than a bottom of the first trench TR1.

Referring to FIGS. 3 and 4A to 4C, a semiconductor layer TP may be formed on an entire surface of the substrate 100. The semiconductor layer TP may be formed to cover the active patterns ACT. The semiconductor layer TP may be formed to partially fill the first and second trenches TR1 and TR2. The semiconductor layer TP may be formed using the same semiconductor material as the substrate 100. For example, the semiconductor layer TP may be a poly-silicon layer.

The semiconductor layer TP may be non-conformally formed. In other words, the semiconductor layer TP may be formed using a deposition condition (or recipe) having a low step coverage. In example embodiments, the step coverage of the deposition process of the semiconductor layer TP may range from 0.5 to 0.85.

In example embodiments, the step coverage may be a ratio of a second thickness T2 of the semiconductor layer TP on the bottom of the first trench TR1 to a first thickness T1 of the semiconductor layer TP on the top surface of the active pattern ACT.

In example embodiments, the step coverage may be a ratio of a third thickness T3 of the semiconductor layer TP on a sidewall of the active pattern ACT at one level LEV to the first thickness T1 of the semiconductor layer TP on the top surface of the active pattern ACT. The one level LEV may be a level at 1200 Å below the top surface of the active pattern ACT. The second thickness T2 may be substantially equal to the third thickness T3.

Figure 17:
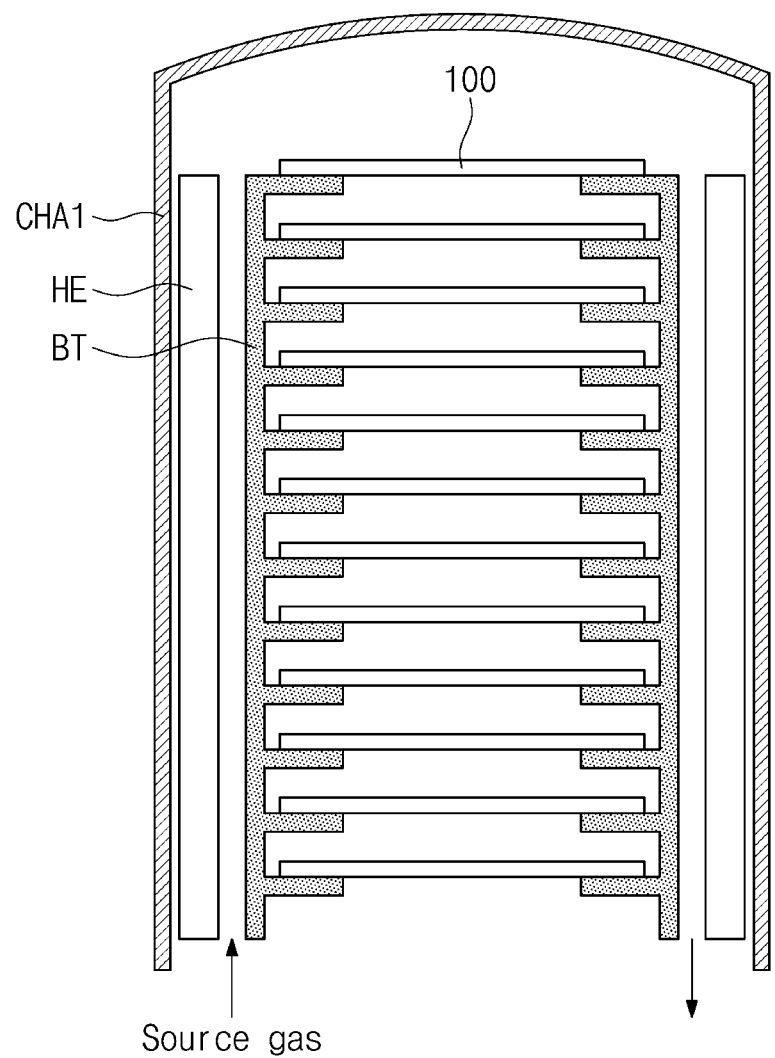
FIGS. 17 and 18 are schematic cross-sectional views illustrating deposition apparatuses for forming a semiconductor layer according to example embodiments.
Figure 18:
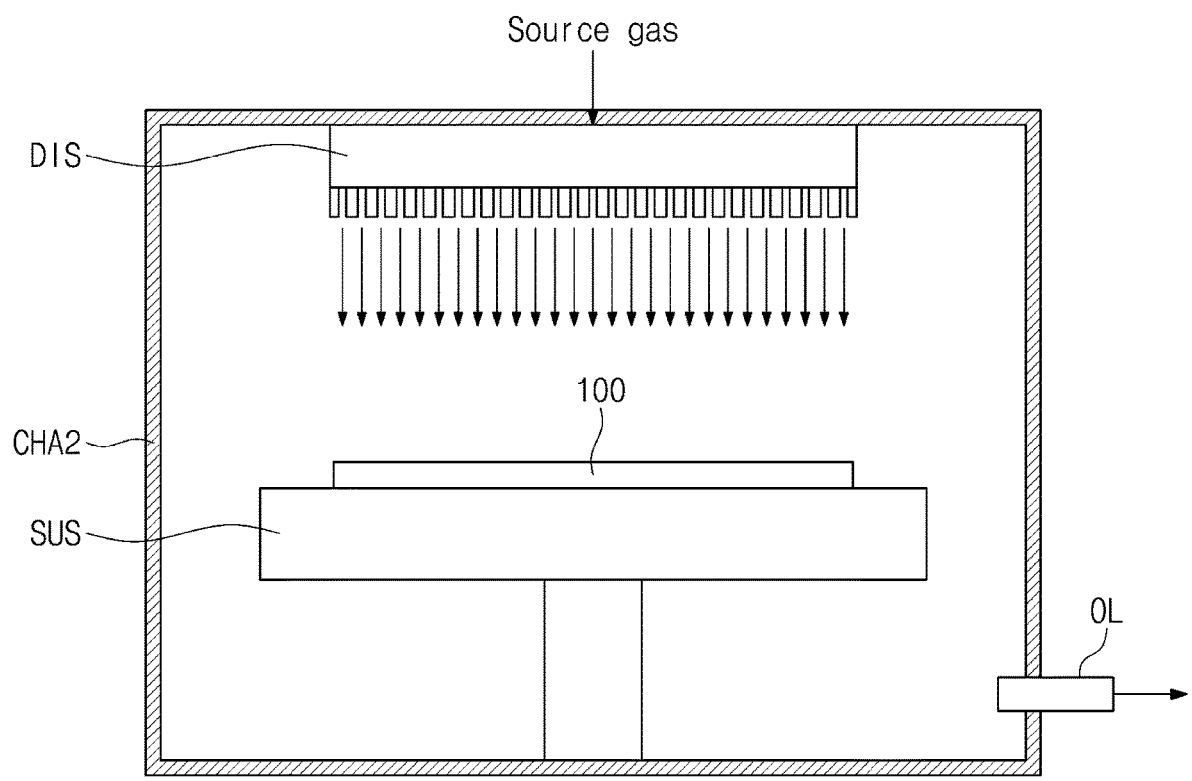

The semiconductor layer TP may be formed using a chemical vapor deposition (CVD) process. FIGS. 17 and 18 are schematic cross-sectional views illustrating deposition apparatuses for forming the semiconductor layer TP according to example embodiments.

A CVD process according to an example embodiment will be described with reference to FIGS. 3, 4A to 4C and 17. A first reaction chamber CHA1 may be a batch-type chamber. The first reaction chamber CHA1 may have a hollow cylindrical shape. A boat BT may be loaded in the first reaction chamber CHA1. The boat BT may have a plurality of slots. The substrate 100 may be inserted in each of the slots. In other words, a plurality of substrates 100 may be disposed in the first reaction chamber CHA1 by the boat BT.

The CVD process may be performed to deposit the semiconductor layer TP on each of the substrates 100 inserted in each of the slots. The CVD process may be performed by injecting a source gas into an inlet of the first reaction chamber CHA1, and exhausting the source gas through an outlet of the first reaction chamber CHA1. A temperature of the CVD process may be controlled by a heater HE disposed in the first reaction chamber CHA1.

As described above, the CVD process according to the present embodiment may use the deposition process having the low step coverage. Reactivity of the CVD process may be improved to lower the step coverage. When the reactivity of the CVD process is improved, most of the source gas may react on an upper portion of the active pattern ACT and a small amount of the source gas may be provided into and react in lower regions of the first and second trenches TR1 and TR2. As a result, the first thickness T1 of the semiconductor layer TP on the top surface of the active pattern ACT may be greater than the second thickness T2 of the semiconductor layer TP on the bottom of the first trench TR1.

When the CVD process is performed using the first reaction chamber CHA1, the source gas of which reactivity is relatively great may be used to improve the reactivity of the CVD process. The reactivity of the source gas may increase as the number of silicon atoms in a molecule of the source gas (e.g., silane) increases. The source gas according to the present embodiment may include $Si_xH_{2x+2}$. Here, 'x' may be an integral number equal to or greater than 3. For example, the source gas according to the present embodiment may include trisilane, tetrasilane or pentasilane.

The CVD process using the first reaction chamber CHA1 may be performed at a pressure of about $1 \times 10^{-1}$ Torr to about 1 Torr and a temperature of about 350□ to about 600 □. A flow rate of the source gas of the CVD process using the first reaction chamber CHA1 may range from about 100 sccm to about 400 sccm.

According to some comparative examples of the inventive concepts, the substrate 100 on which the active patterns ACT were formed was disposed in the first reaction chamber CHA1. A CVD process was performed using tetrasilane ($Si_4H_{10}$) as the source gas to form the semiconductor layer TP (Experimental Example 1). A pressure in the first reaction chamber CHA1 was $1 \times 10^{-1}$ Torr and a temperature in the first reaction chamber CHA1 was 400 □ during the CVD process. The step coverage of the CVD process of the Experimental Example 1 was confirmed through measuring a thickness of the semiconductor layer TP.

According to some comparative examples of the inventive concepts, a CVD process was carried out under the same conditions as in the Experimental Example 1 except that disilane ($Si_2H_6$) was used as the source gas (Comparative Example 1). The step coverage of the CVD process of the Comparative Example 1 was confirmed through measuring a thickness of the semiconductor layer TP. The results are shown in Table 1 below.

TABLE 1

|  | Experimental Example 1 ($Si_4H_{10}$) | Comparative Example 1 ($Si_2H_6$) |
| --- | --- | --- |
| Step Coverage | 0.8 to 0.85 | 0.95 to 0.99 |

Referring to Table 1, the step coverage of the CVD process of the Experimental Example 1 was significantly lower than the step coverage of the Comparative Example 1. In other words, by controlling the number of silicon atoms in a molecule of the source gas, it is possible to realize a CVD process with the desired step coverage of the inventive concepts.

A CVD process according to another example embodiment of the inventive concepts will be described with reference to FIGS. 3, 4A to 4C and 18. A second reaction chamber CHA2 may be a single-type chamber. A susceptor SUS may be disposed in the second reaction chamber CHA2. A single substrate 100 may be disposed on the susceptor SUS. The susceptor SUS may heat the substrate 100. A distribution plate DIS may be provided over the susceptor SUS in the second reaction chamber CHA2.

The CVD process may be performed to deposit the semiconductor layer TP on the substrate 100. The CVD process in the present embodiment may be performed by injecting a source gas into the distribution plate DIS of the second reaction chamber CHA2, and exhausting the source gas through an outlet of the second reaction chamber CHA2.

As described above, the CVD process according to the present embodiment may use the deposition process having the low step coverage. Reactivity of the CVD process may be improved to lower the step coverage. When the CVD process is performed using the second reaction chamber CHA2, a process condition of a relatively high pressure may be used to improve the reactivity of the CVD process.

In the first reaction chamber CHA1 described above with reference to FIG. 17, the CVD process should be uniformly performed on the plurality of substrates 100. Thus, the inside of the first reaction chamber CHA1 cannot be maintained at a high pressure. On the contrary, since the second reaction chamber CHA2 according to the present embodiment is the single-type chamber in which the single substrate 100 is loaded, the inside of the second reaction chamber CHA2 may be maintained at a high pressure. As a result, the pressure of the inside of the second reaction chamber CHA2 may be increased to improve the reactivity of the CVD process.

The CVD process using the second reaction chamber CHA2 may be performed at a high pressure of about 10 Torr to about 200 Torr and a temperature of about 400 □ to about 600□. A flow rate of the source gas of the CVD process using the second reaction chamber CHA2 may range from about 5 sccm to about 50 sccm.

Since the reactivity of the CVD process using the second reaction chamber CHA2 is adjusted using the relatively high pressure, a kind of the source gas used in the CVD process may be various. For example, the source gas according to the present embodiment may include $Si_xH_{2x+2}$, $SiCl_4$, $SiCl_6$, or $SiCl_2H_4$. Here, 'x' may be an integral number equal to or greater than 1. In example embodiments, the source gas may include monosilane or disilane.

Hydrogen may be additionally injected together with the source gas in the CVD process using the second reaction chamber CHA2. Since the hydrogen is additionally injected, the reactivity of the CVD process may be more improved.

In example embodiments, even though not shown in the drawings, a semiconductor nitride layer may be formed to cover the active patterns ACT, and then, the semiconductor layer TP may be formed on the semiconductor nitride layer. The formation of the semiconductor nitride layer and the formation of the semiconductor layer TP may be sequentially performed in the first reaction chamber CHA1 of FIG. 17 or the second reaction chamber CHA2 of FIG. 18. The formation of the semiconductor nitride layer may use aminosilane as a source gas.

Referring to FIGS. 5 and 6A to 6C, a device isolation layer ST may be formed to fill the first and second trenches TR1 and TR2. The device isolation layer ST may completely fill the first and second trenches TR1 and TR2 and may cover the active patterns ACT and the semiconductor layer TP formed thereon. For example, the device isolation layer ST may include a silicon oxide layer.

The formation of the device isolation layer ST may include performing a semiconductor oxidation process. During the semiconductor oxidation process, the semiconductor layer TP may be oxidized to form a semiconductor oxide layer (e.g., a silicon oxide layer). The semiconductor oxide layer may form at least a portion of the device isolation layer ST.

The amount of the semiconductor material oxidized by the semiconductor oxidation process may increase as a level in the fourth direction D4 increases (i.e., as a distance from the bottom surface of the substrate 100 increases). For example, the semiconductor material on the top surface of the active pattern ACT may be oxidized such that its thickness is reduced by the first thickness T1, and the semiconductor material on the bottom of the first trench TR1 may be oxidized such that its thickness is reduced by the second thickness T2. The first thickness T1 may be greater than the second thickness T2. This may be because oxidation reactivity of the semiconductor oxidation process increases as a distance from the bottom surface of the substrate 100 increases.

In consideration of the semiconductor oxidation process, the semiconductor layer TP described above with reference to FIGS. 3 and 4A to 4C may be formed in such a way that its thickness increases as a distance from the bottom surface of the substrate 100 increases. Thus, during the semiconductor oxidation process, the semiconductor layer TP may be selectively oxidized but the active patterns ACT may remain without being oxidized. In other words, during the semiconductor oxidation process, the semiconductor layer TP may protect the active patterns ACT from being oxidized.

Referring to FIGS. 7 and 8A to 8C, a planarization process may be performed on the device isolation layer ST until the top surfaces of the active patterns ACT are exposed. The active patterns ACT and the device isolation layer ST may be patterned to form third trenches TR3. Each of the third trenches TR3 may have a line shape extending in the second direction D2 when viewed in a plan view.

The third trenches TR3 may be formed by forming a hard mask pattern including openings, and etching the active patterns ACT and the device isolation layer ST, which are exposed through the openings, by using the hard mask pattern as an etch mask. The third trench TR3 may be formed to be shallower than the first trench TR1.

Figure 8A:
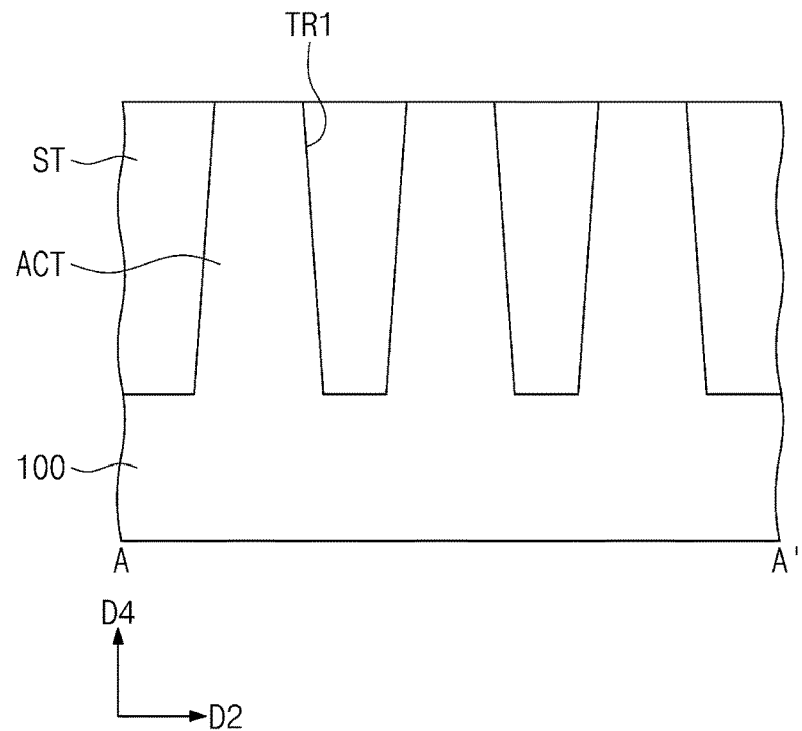
Figure 8B:
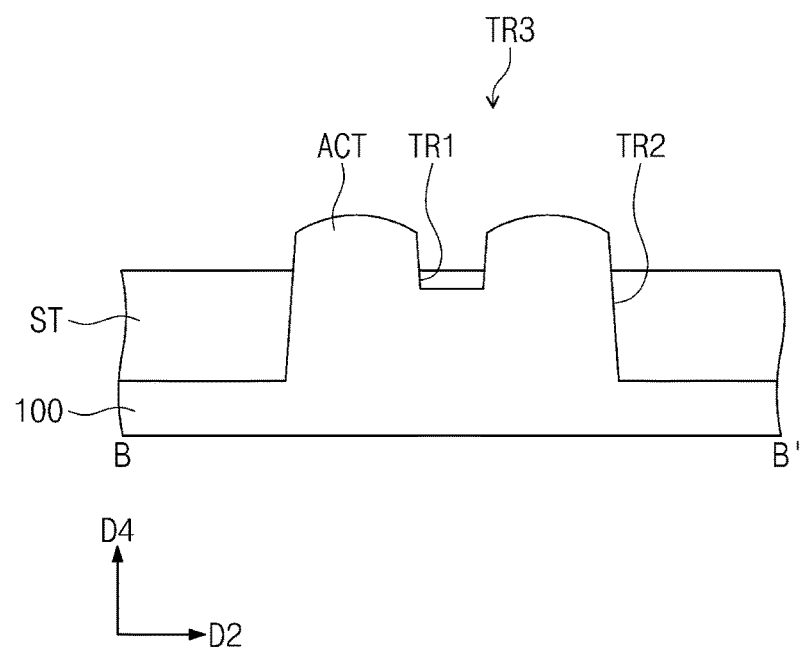
Figure 8C:
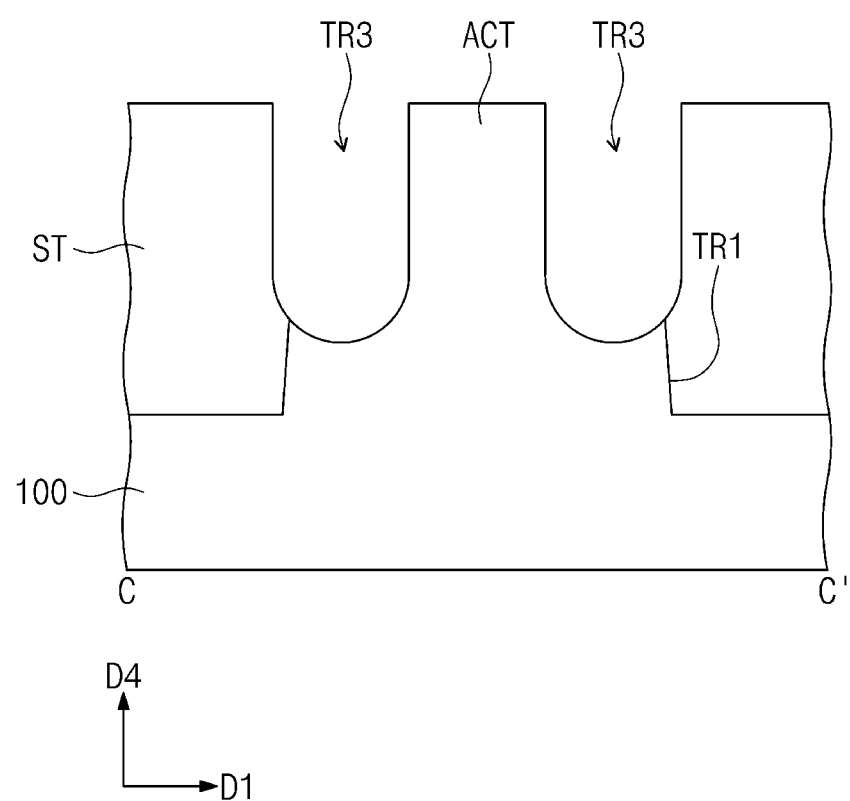
Figure 9:
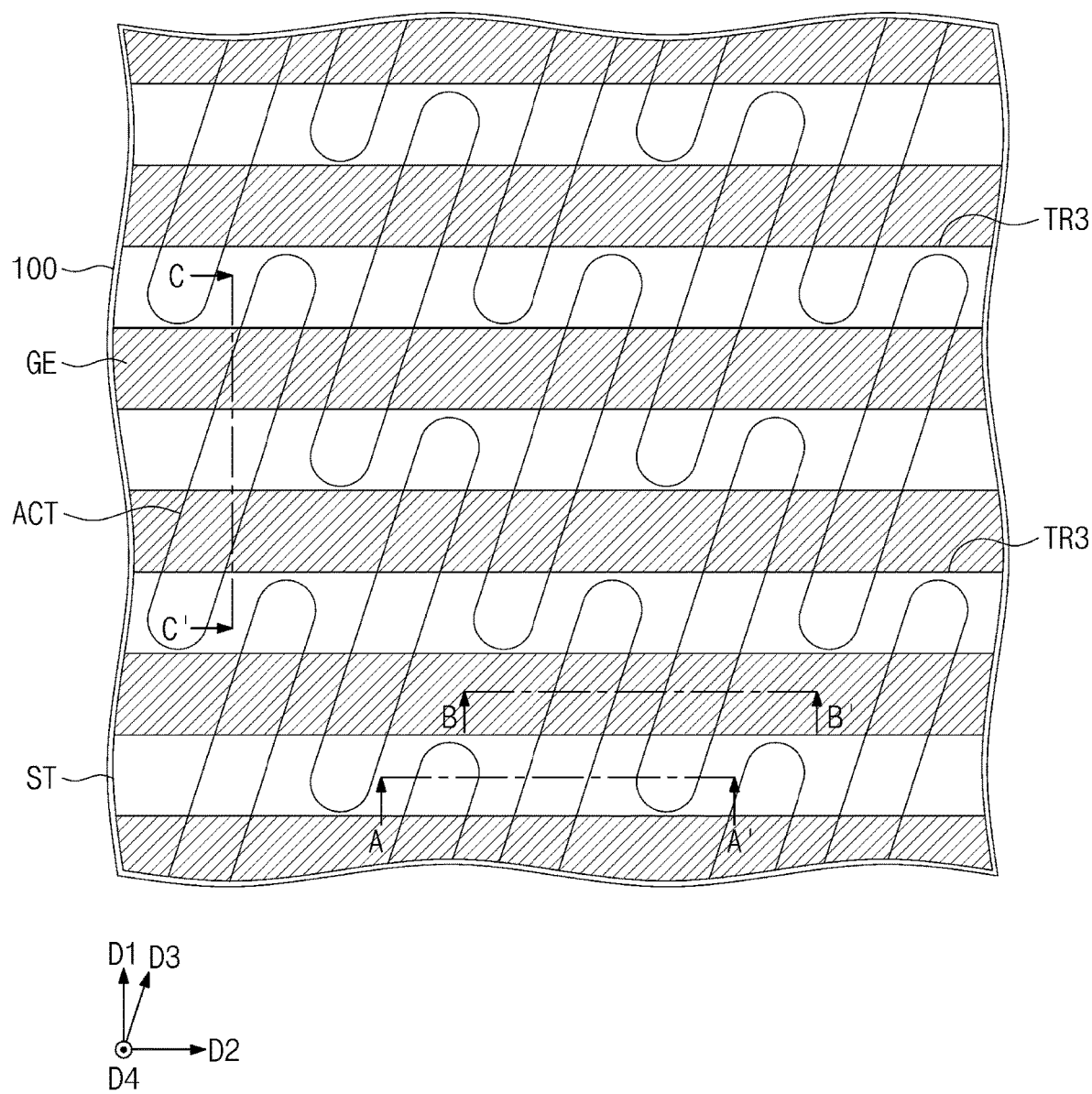
Figure 10A:
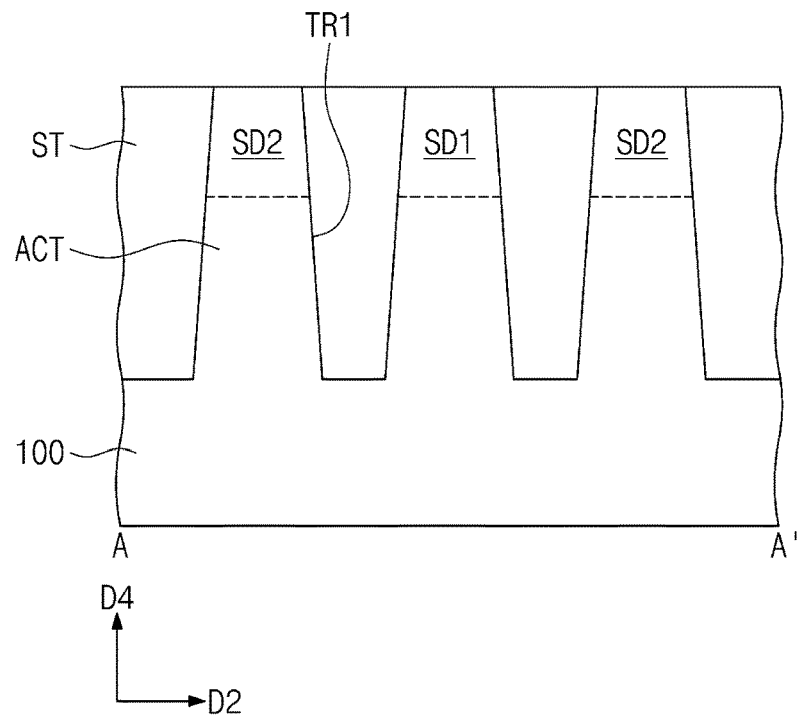
Figure 10B:
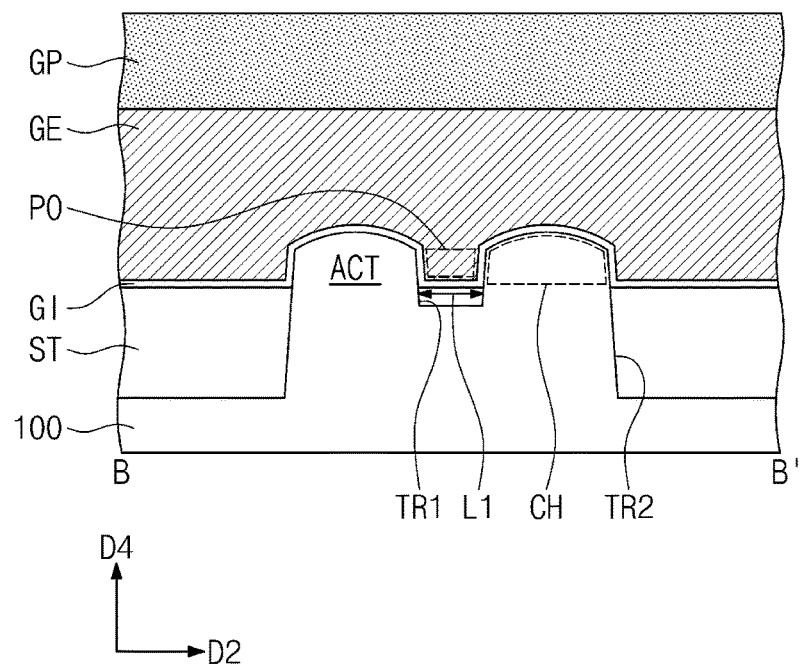
Figure 10C:
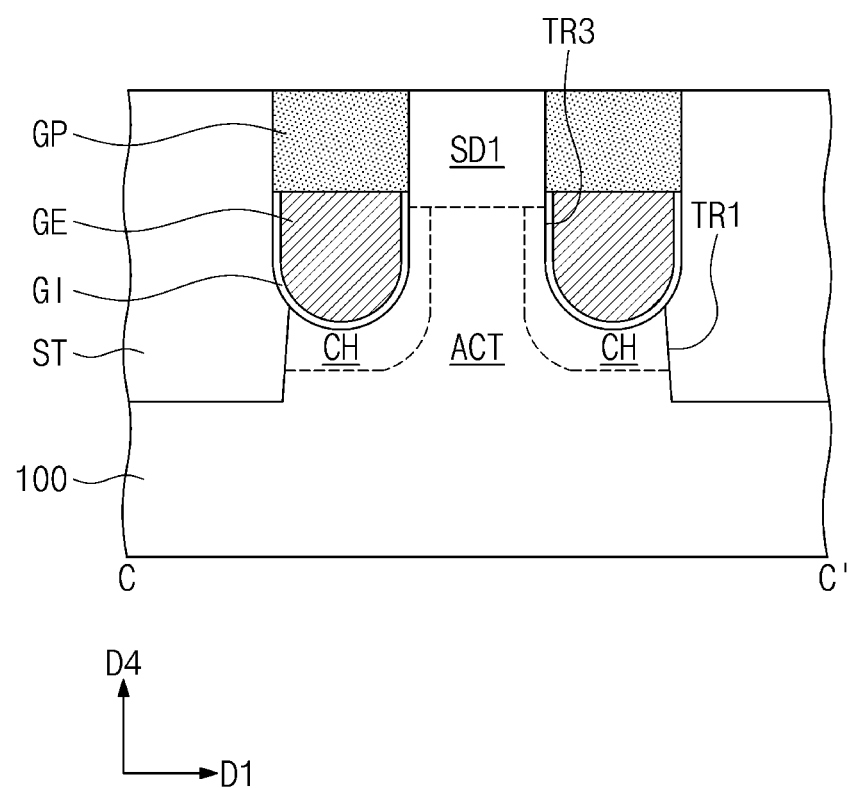
Figure 11:
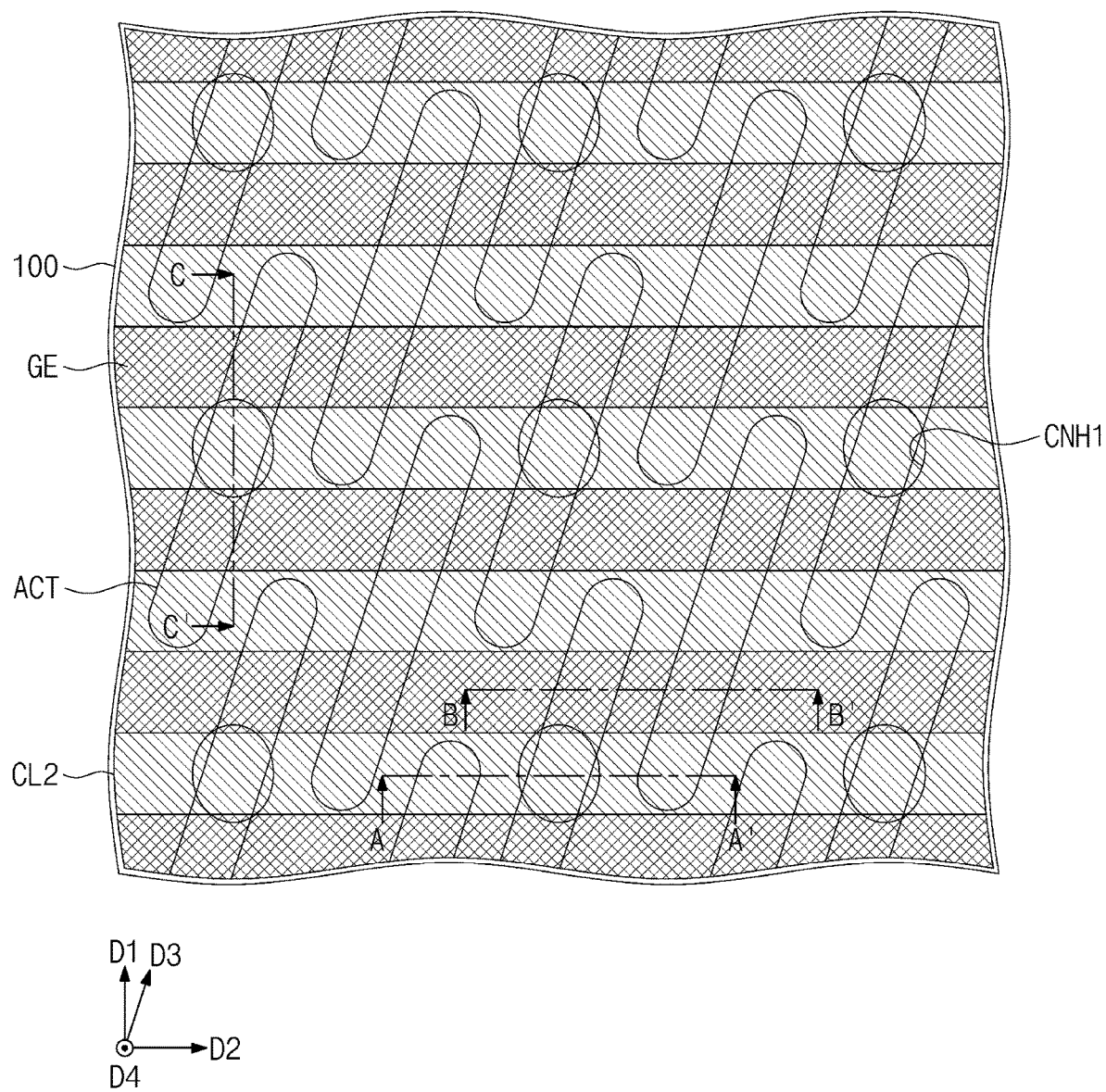
Figure 12A:
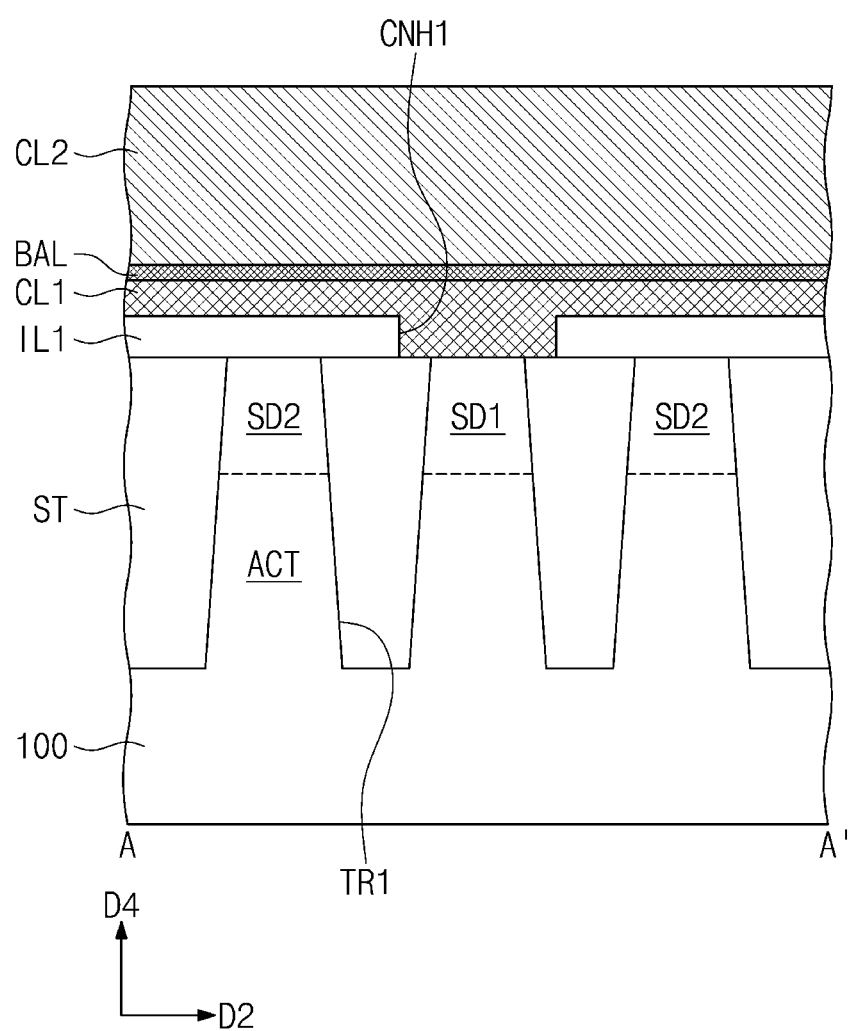
Figure 12B:
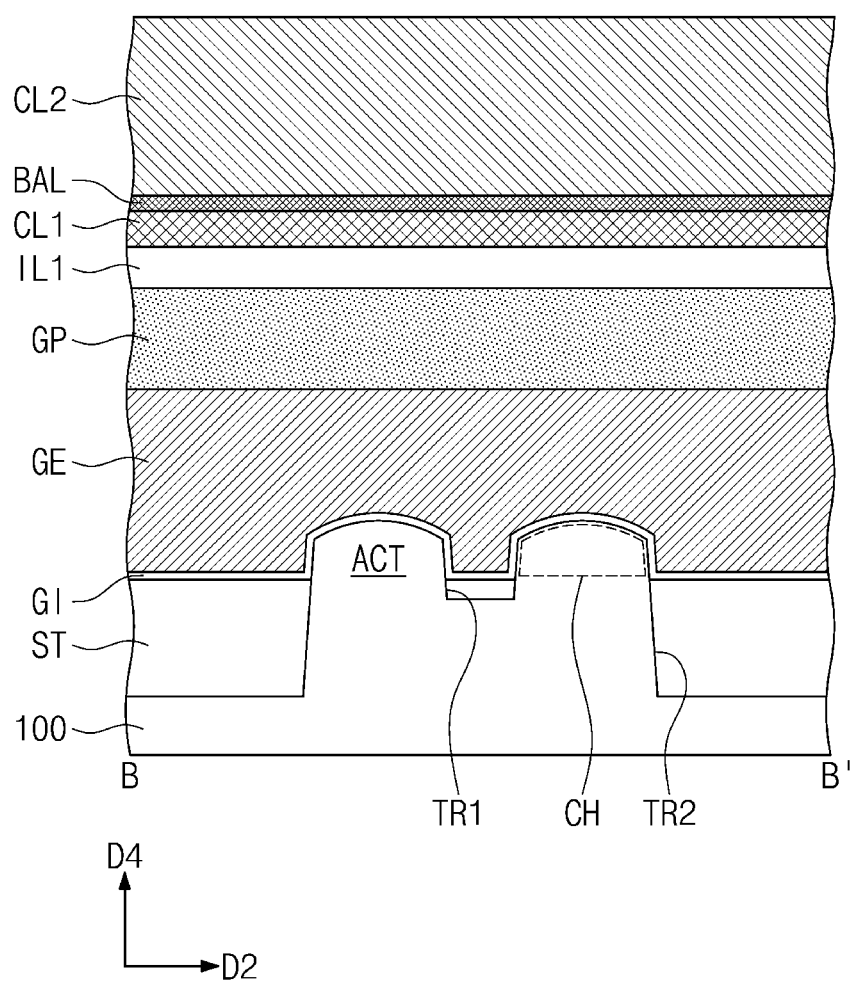
Figure 12C:
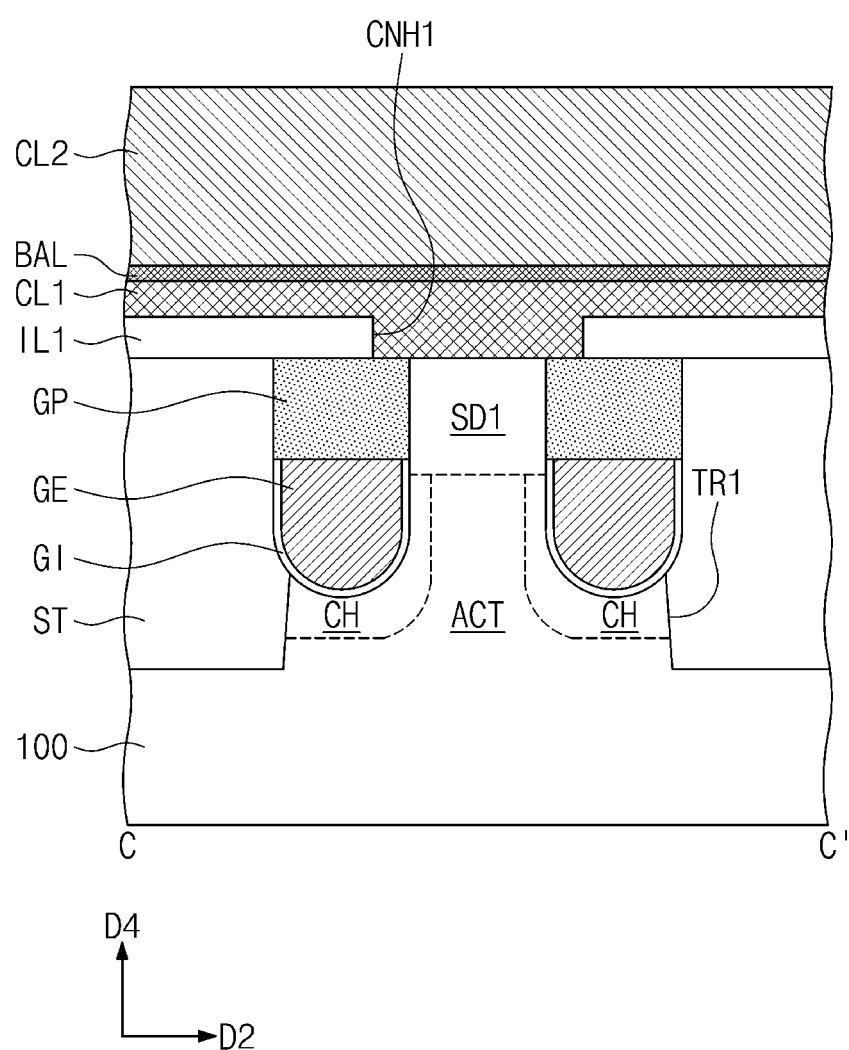
Figure 13:
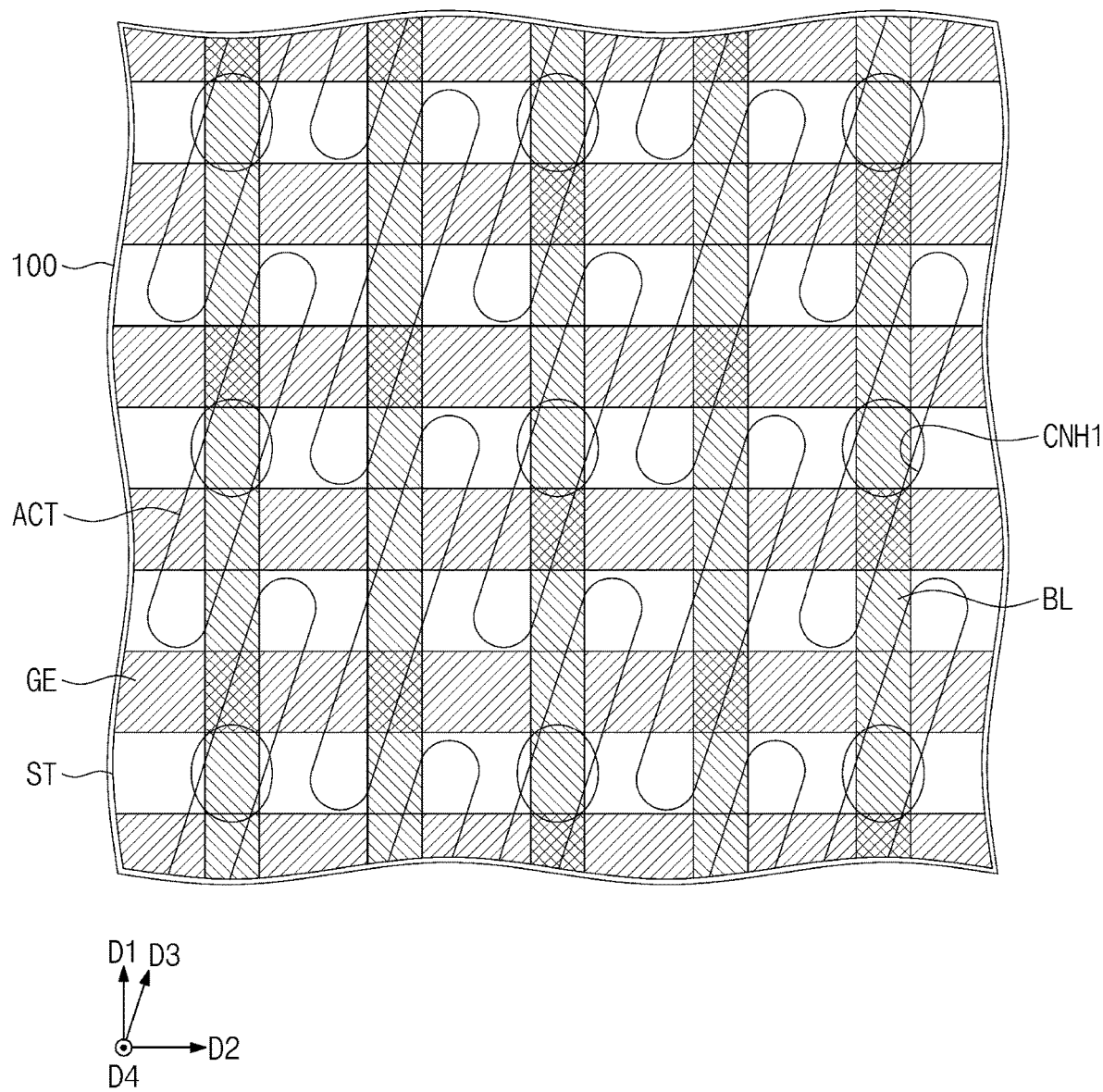
Figure 14A:
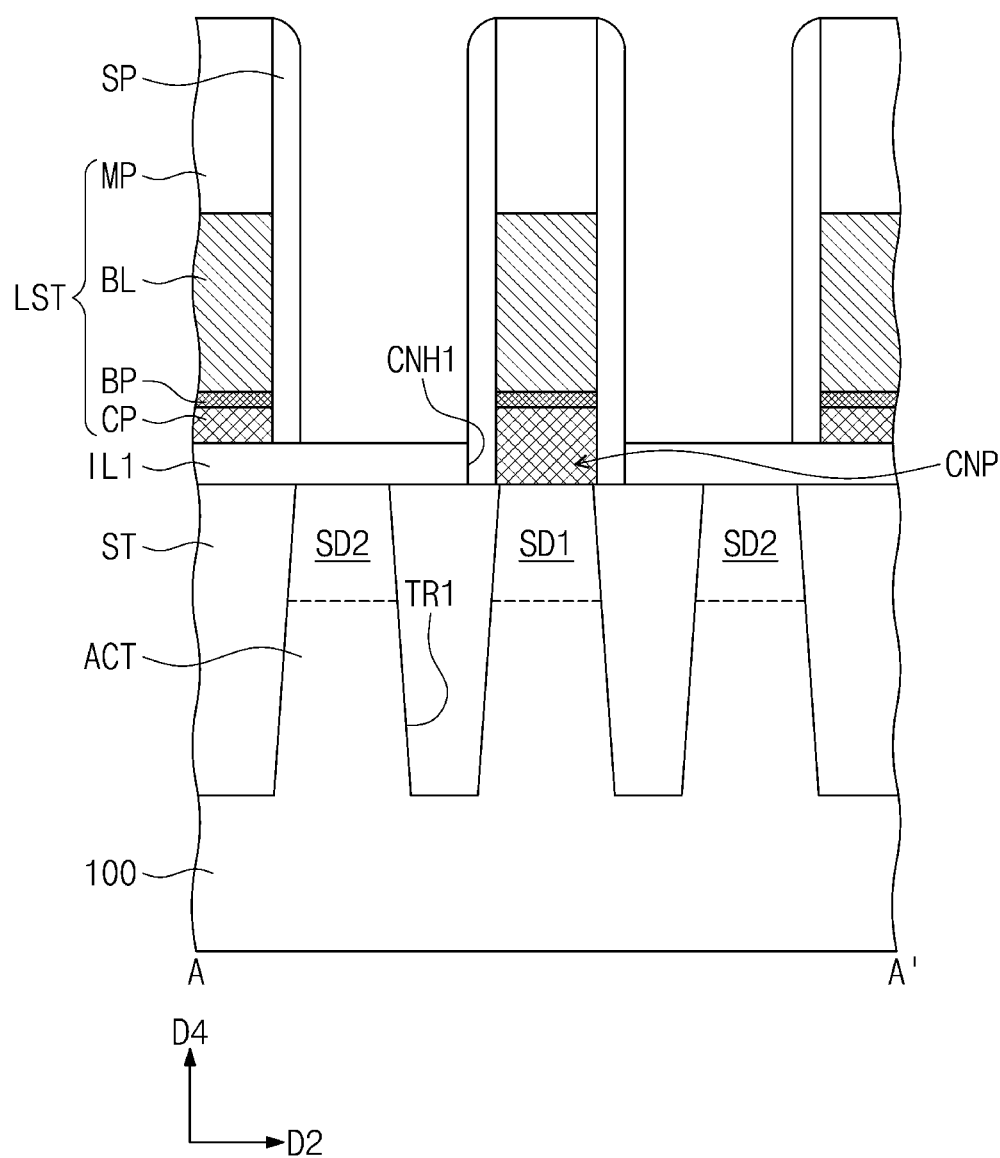
Figure 14B:
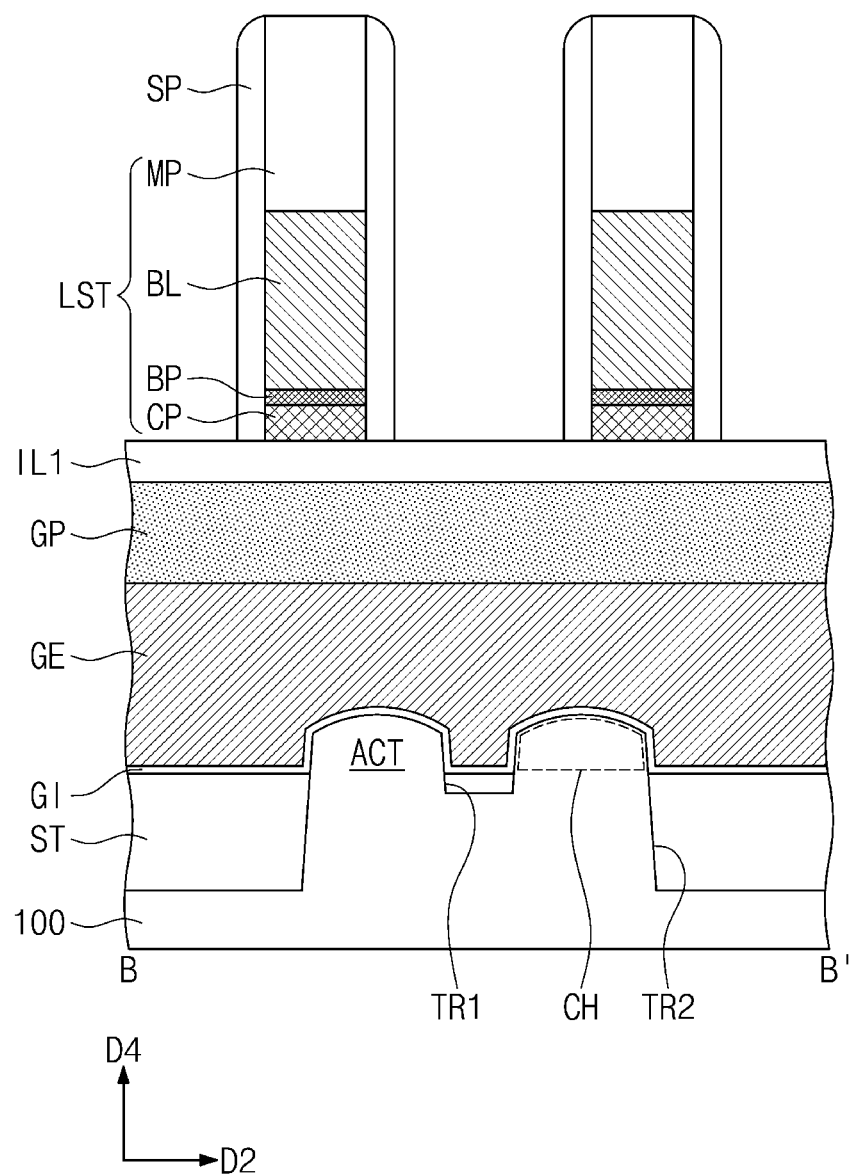
Figure 14C:
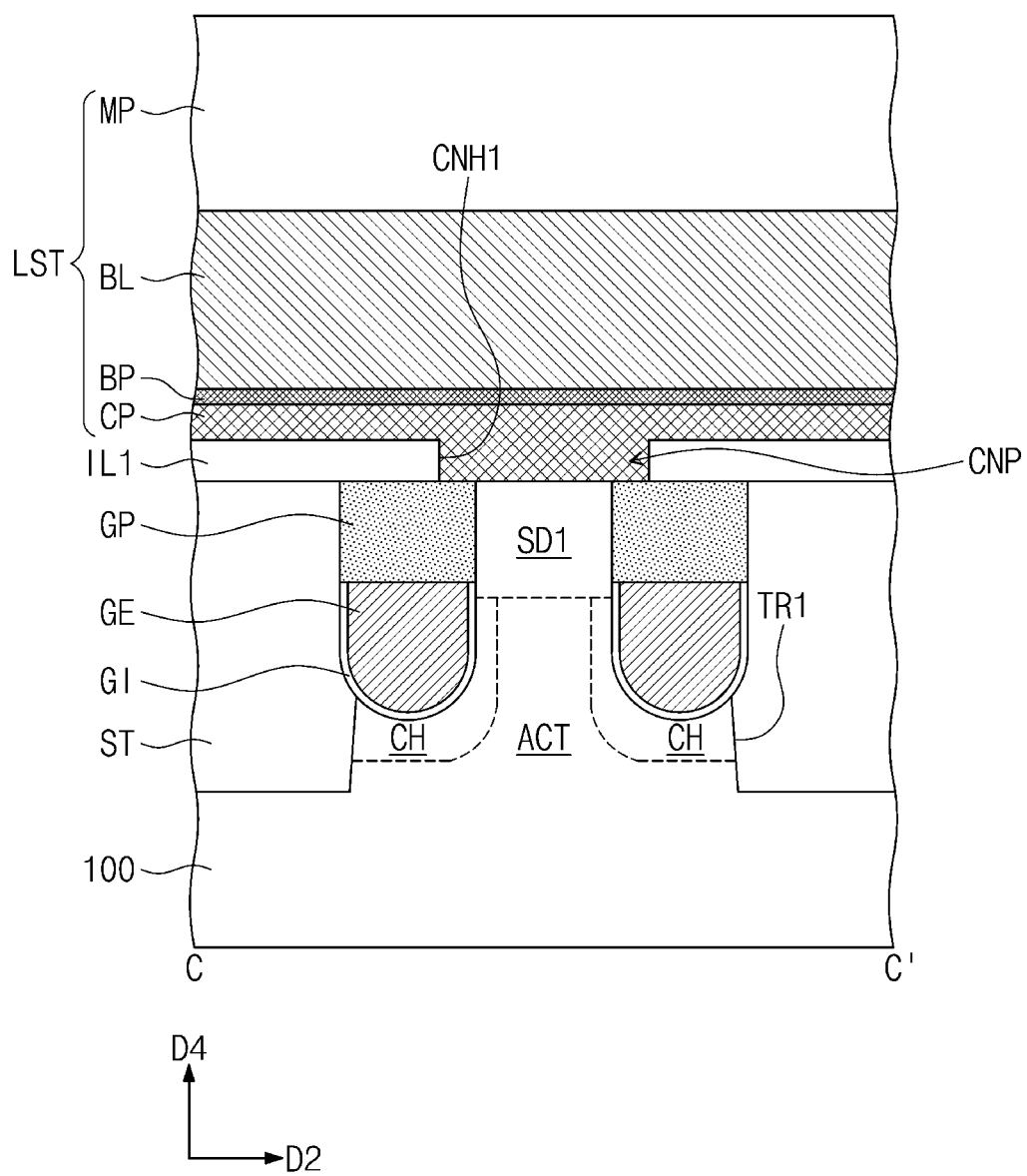

During the etching process, the device isolation layer ST may be etched more than the active patterns ACT (see FIG. 8B). Upper portions of the active patterns ACT in the third trench TR3 may protrude vertically from the device isolation layer ST in the third trench TR3. In other words, the upper portions of the active patterns ACT in the third trench TR3 may have fin shapes.

Referring to FIGS. 9 and 10A to 10C, a gate dielectric layer GI, a gate electrode GE and a gate capping layer GP may be formed in each of the third trenches TR3.

In more detail, the gate dielectric layer GI may be conformally formed in each of the third trenches TR3. For example, the gate dielectric layer GI may include a silicon oxide layer, a silicon nitride layer, a silicon oxynitride layer, and/or a high-k dielectric layer. For example, the high-k dielectric layer may include hafnium oxide, hafnium-silicon oxide, lanthanum oxide, zirconium oxide, zirconium-silicon oxide, tantalum oxide, titanium oxide, barium-strontium-titanium oxide, barium-titanium oxide, strontium-titanium oxide, lithium oxide, aluminum oxide, lead-scandium-tantalum oxide, lead-zinc niobate, or any combination thereof.

A conductive layer filling the third trenches TR3 may be formed on the gate dielectric layer GI to form the gate electrodes GE. For example, the conductive layer may include at least one of a conductive metal nitride (e.g., titanium nitride or tantalum nitride) or a metal material (e.g., titanium, tantalum, tungsten, copper, or aluminum).

The gate dielectric layer GI and the gate electrode GE may be recessed, and the gate capping layer GP may be formed on the recessed gate electrode GE. A top surface of the gate capping layer GP may be substantially coplanar with the top surface of the active pattern ACT. The gate capping layer GP may include at least one of a silicon oxide layer, a silicon nitride layer, or a silicon oxynitride layer.

A dopant implantation process may be performed on the active patterns ACT to form a first dopant region SD1 and a pair of second dopant regions SD2 in an upper portion of each of the active patterns ACT where the third trenches TR3 were not formed. The pair of second dopant regions SD2 may be spaced apart from each other in the third direction D2 with the first dopant region SD1 interposed therebetween. The first and second dopant regions SD1 and SD2 may have the same conductivity type (e.g., an N-type).

Referring again to FIGS. 10B and 10C, a region of the active pattern ACT under the gate electrode GE may be defined as a channel region CH. The channel region CH may be disposed between the first dopant region SD1 and the second dopant region SD2 when viewed in a plan view. The gate electrode GE may be provided on a top surface and both sidewalls of the channel region CH.

According to the example embodiments, since the semiconductor layer TP is completely oxidized during the formation of the device isolation layer ST described above with reference to FIGS. 5 and 6A to 6C, the distance L1 between two active patterns ACT adjacent to each other in the second direction D2 may be sufficiently secured. Thus, at least a portion PO of the gate electrode GE may be disposed between two channel regions CH adjacent to each other in the second direction D2. Here, at least a lower portion of the two active patterns ACT is completely oxidized to secure a space for the gate electrode GE to be filled in the first trench between these two active patterns ACT. In addition, since the semiconductor layer TP is completely oxidized, it is possible to prevent a defect which may be generated in the active pattern ACT. Thus, it is possible to prevent a leakage current from being generated through a region of the active pattern ACT adjacent to the gate electrode GE. Furthermore, since the semiconductor layer TP on the top surface of the active pattern ACT is selectively oxidized but the active patterns ACT remains without being oxidized, a contact area between the active pattern ACT and a contact CNT may be sufficiently secured.

Referring to FIGS. 11 and 12A to 12C, a first interlayer insulating layer IL1 may be formed on an entire surface of the substrate 100. For example, the first interlayer insulating layer IL1 may include a silicon oxide layer. The first interlayer insulating layer IL1 may be patterned to form first contact holes CNH1 exposing the first dopant regions SD1 of the active patterns ACT, respectively.

A first conductive layer CL1, a barrier layer BAL and a second conductive layer CL2 may be sequentially formed on the first interlayer insulating layer ILL The first conductive layer CL1 may fill the first contact holes CNH1. In other words, the first conductive layer CL1 may be in contact with the first dopant regions SD1 of the active patterns ACT. The first conductive layer CL1 may be vertically spaced apart from the second dopant regions SD2 of the active patterns ACT by the first interlayer insulating layer ILL The first conductive layer CL1 may include at least one of a doped semiconductor material (e.g., doped silicon or doped germanium), a metal material (e.g., titanium, tantalum, tungsten, copper, or aluminum), or a metal-semiconductor compound (e.g., tungsten silicide, cobalt silicide, or titanium silicide).

The barrier layer BAL may be disposed between the first conductive layer CL1 and the second conductive layer CL2. For example, the barrier layer BAL may include a conductive metal nitride (e.g., titanium nitride or tantalum nitride). The second conductive layer CL2 may include a metal material (e.g., titanium, tantalum, tungsten, copper, or aluminum). The barrier layer BAL may inhibit or prevent the metal material in the second conductive layer CL2 from being diffused into the first conductive layer CL1.

Referring to FIGS. 13 and 14A to 14C, line structures LST extending in a first direction D1 may be formed on the first interlayer insulating layer ILL The line structures LST may be spaced apart from each other in the second direction D2.

In more detail, mask patterns MP may be formed on the second conductive layer CL2. The mask patterns MP may have line shapes extending in the first direction D1. For example, the mask patterns MP may include a silicon nitride layer or a silicon oxynitride layer.

The second conductive layer CL2, the barrier layer BAL and the first conductive layer CL1 may be sequentially etched using the mask patterns MP as etch masks to form a bit line BL, a barrier pattern BP and a conductive pattern CP under each of the mask patterns MP. The mask pattern MP, the bit line BL, the barrier pattern BP and the conductive pattern CP may vertically overlap with each other. The mask pattern MP, the bit line BL, the barrier pattern BP and the conductive pattern CP may constitute the line structure LST. The bit lines BL may extend to intersect the gate electrodes GE, when viewed in a plan view.

The conductive pattern CP may include contact portions CNP filling the first contact holes CNH1, respectively. The conductive pattern CP may be connected to the first dopant region SD1 through the contact portion CNP. In other words, the bit line BL may be electrically connected to the first dopant region SD1 through the conductive pattern CP.

A pair of spacers SP may be formed on both sidewalls of each of the line structures LST. The formation of the spacers SP may include conformally forming a spacer layer on the substrate 100 and anisotropically etching the spacer layer. The spacer layer may include at least one of a silicon oxide layer, a silicon nitride layer, or a silicon oxynitride layer.

Referring to FIGS. 15 and 16A to 16C, a second interlayer insulating layer IL2 may be formed on the substrate 100. For example, the second interlayer insulating layer IL2 may include a silicon oxide layer. A planarization process may be performed on the second interlayer insulating layer IL2 until top surfaces of the mask patterns MP are exposed.

The second interlayer insulating layer IL2 and the first interlayer insulating layer IL1 may be patterned to form second contact holes CNH2 exposing the second dopant regions SD2 of the active patterns ACT, respectively. The mask patterns MP and the spacers SP may be used as etch masks during the patterning process, and thus the second contact holes CNH2 may be formed to be self-aligned with the mask patterns MP and the spacers SP.

Contacts CNT may be formed by filling the second contact holes CNH2 with a conductive material. For example, the conductive material may include at least one of a conductive metal nitride (e.g., titanium nitride or tantalum nitride) or a metal material (e.g., titanium, tantalum, tungsten, copper, or aluminum). The contacts CNT may be connected to the second dopant regions SD2, respectively. The contacts CNT may be spaced apart from the bit lines BL by the spacers SP.

Data storage elements DS may be formed on the contacts CNT, respectively. For example, each of the data storage elements DS may be a memory element using a capacitor, a memory element using a magnetic tunnel junction (MTJ) pattern, or a memory element using a variable resistor including a phase-change material. In example embodiments, each of the data storage elements DS may be a capacitor.

A semiconductor device according to example embodiments of the inventive concepts will be described with reference to FIGS. 15 and 16A to 16C. The device isolation layer ST may be provided in an upper portion of the substrate 100 to define the active patterns ACT. Each of the active patterns ACT may extend in the third direction D3. Some of the active patterns ACT may be spaced apart from each other in the third direction D3. The active patterns ACT may be two-dimensionally arranged.

The device isolation layer ST may fill the first and second trenches TR1 and TR2 between the active patterns ACT. The first trench TR1 may be defined between two active patterns ACT adjacent to each other in the second direction D2. The second trench TR2 may be defined between two active patterns ACT adjacent to each other in the third direction D3. The second trench TR2 may be deeper than the first trench TR1.

Each of the active patterns ACT may include the first dopant region SD1 and the pair of second dopant regions SD2. The first dopant region SD1 may be located between the pair of second dopant regions SD2. The first and second dopant regions SD1 and SD2 may have the same conductivity type (e.g., an N-type).

A pair of the third trenches TR3 may be defined in an upper portion of each of the active patterns ACT. Each of the third trenches TR3 may be defined between the first dopant region SD1 and the second dopant region SD2. The third trench TR3 may extend downward from the top surface of the active pattern ACT toward the bottom surface of the substrate 100. A bottom of the third trench TR3 may be higher than the bottoms of the first and second trenches TR1 and TR2.

Each of the active patterns ACT may also include a pair of the channel regions CH. The channel region CH may be disposed between the first dopant region SD1 and the second dopant region SD2 when viewed in a plan view. The channel region CH may be located under the third trench TR3. Thus, the channel region CH may be lower than the first and second dopant regions SD1 and SD2.

The gate electrodes GE may be provided to intersect the active patterns ACT and the device isolation layer ST. The gate electrodes GE may be provided in the third trenches TR3. The gate electrodes GE may extend in the second direction D2 in parallel to each other. A pair of the gate electrodes GE may be respectively provided on the pair of channel regions CH of each of the active patterns ACT. Top surfaces of the gate electrodes GE may be lower than the top surfaces of the active patterns ACT (e.g., top surfaces of the first dopant regions SD1 or top surfaces of the second dopant regions SD2).

Referring again to FIG. 16B, the channel region CH under the gate electrode GE may protrude vertically from the device isolation layer ST under the gate electrode GE. In other words, the channel region CH under the gate electrode GE may be located at a higher level than a top surface of the device isolation layer ST under the gate electrode GE. The channel region CH under the gate electrode GE may have a fin shape. A first bottom surface of the gate electrode GE above the device isolation layer ST may be lower than a second bottom surface of the gate electrode GE above the channel region CH.

At least a portion PO of the gate electrode GE may be disposed between a pair of the channel regions CH adjacent to each other in the second direction D2. The portion PO of the gate electrode GE may be disposed on the device isolation layer ST in the first trench TR1.

According to example embodiments, the distance L1 between the pair of active patterns ACT adjacent to each other in the second direction D2 may be secured such that the portion PO of the gate electrode GE is disposed between the pair of active patterns ACT. Thus, the gate electrode GE may surround the top surface and the both sidewalls of the channel region CH to improve electrical characteristics of a transistor including the gate electrode GE.

Referring again to FIGS. 15 and 16A to 16C, the gate dielectric layer GI may be disposed between the gate electrode GE and the active pattern ACT. The gate capping layer GP may be provided on the gate electrode GE. The gate capping layer GP may cover the top surface of the gate electrode GE. The top surface of the gate capping layer GP may be substantially coplanar with the top surface of the active pattern ACT.

The first interlayer insulating layer IL1 may be provided on the substrate 100. The first interlayer insulating layer IL1 may include the first contact holes CNH1 exposing the first dopant regions SD1 of the active patterns ACT.

The line structures LST extending in the first direction D1 may be provided on the first interlayer insulating layer ILL The line structures LST may be spaced apart from each other in the second direction D2. The line structures LST may intersect the gate electrodes GE when viewed in a plan view. The pair of spacers SP may be provided on the both sidewalls of each of the line structures LST.

Each of the line structures LST may include the conductive pattern CP, the barrier pattern BP, the bit line BL and the mask pattern MP, which are sequentially stacked. The conductive pattern CP may include the contact portion CNP which fills the first contact hole CNH1 and is in contact with the first dopant region SD1. The bit line BL may be electrically connected to the first dopant region SD1 through the barrier pattern BP and the conductive pattern CP.

The second interlayer insulating layer IL2 may be provided on the first interlayer insulating layer ILL The second interlayer insulating layer IL2 may cover the spacers SP. The contacts CNT may penetrate the second interlayer insulating layer IL2 and the first interlayer insulating layer IL1 so as to be connected to the second dopant regions SD2, respectively. The contacts CNT may be spaced apart from the bit lines BL by the spacers SP. The data storage elements DS may be provided on the contacts CNT, respectively. In example embodiments, each of the data storage elements DS may be the capacitor.

Figure 5:
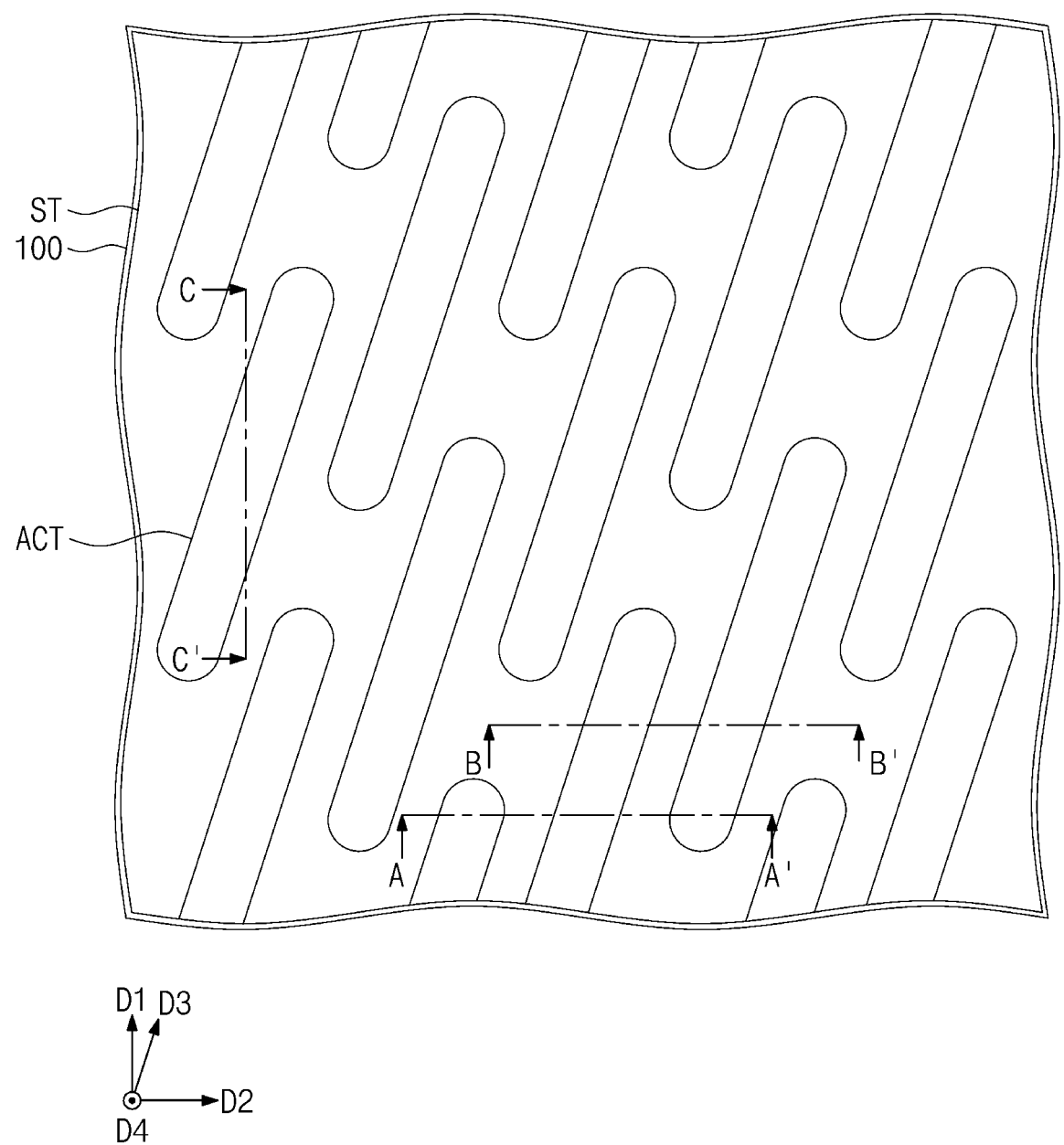
Figure 6A:
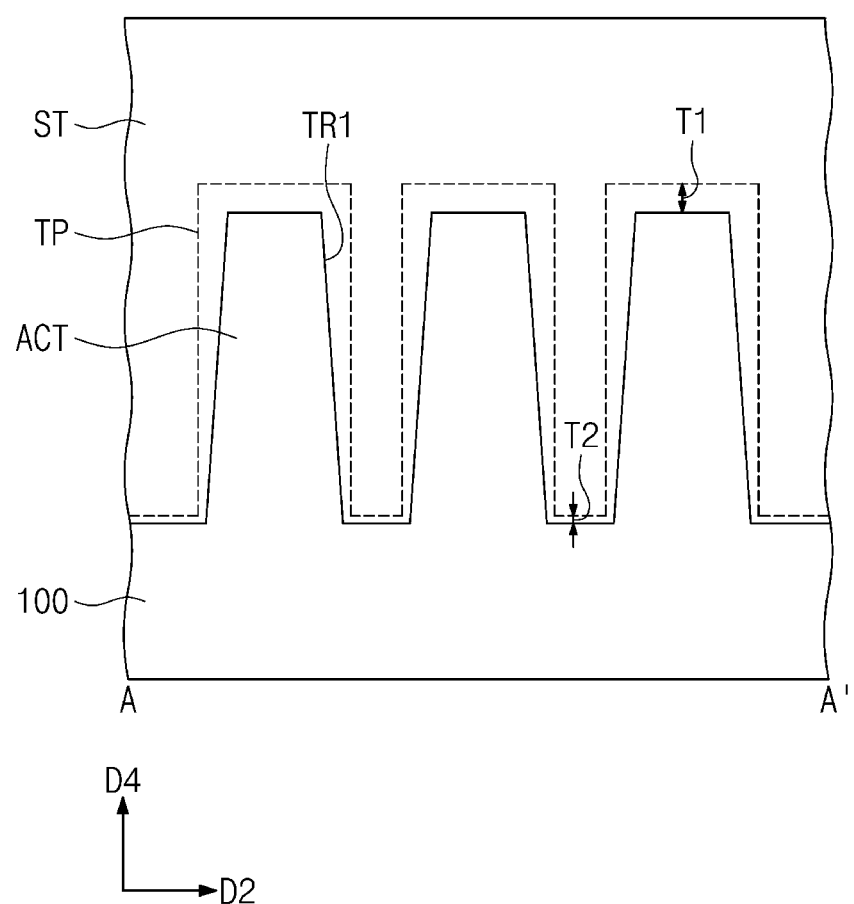
Figure 6B:
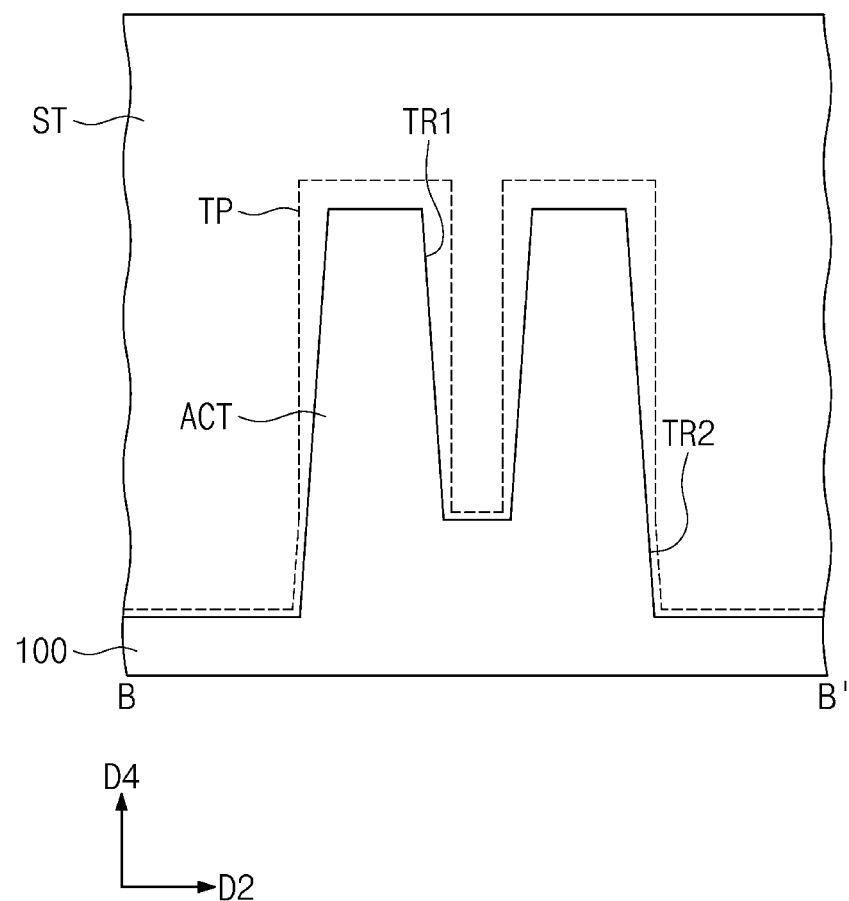
Figure 6C:
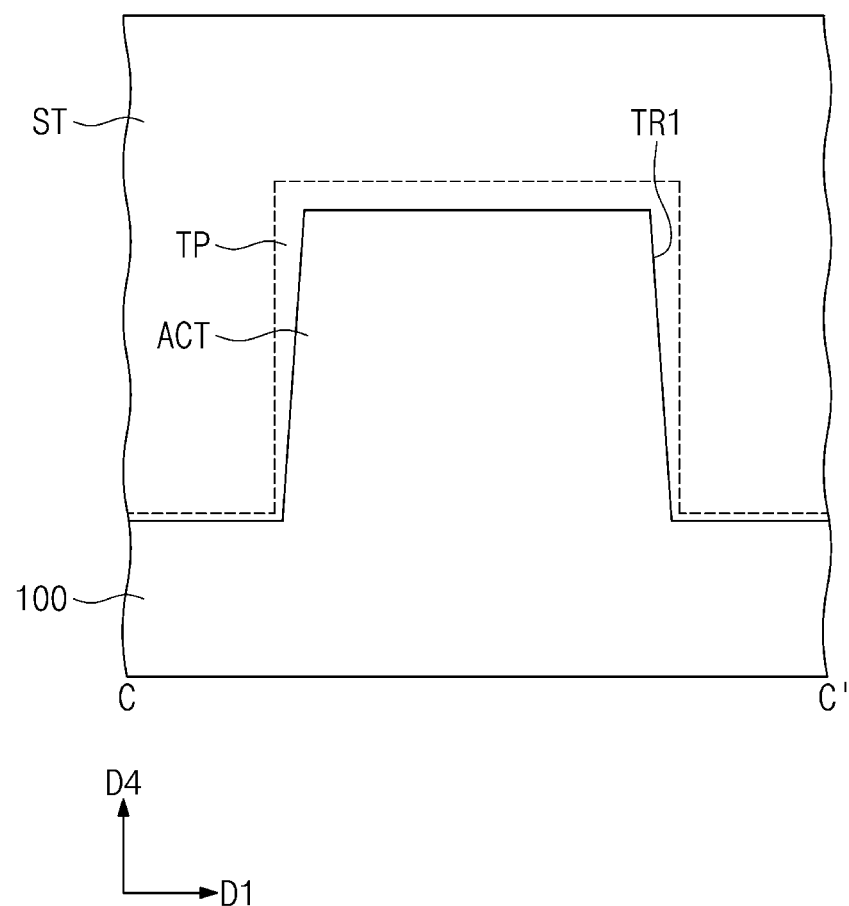
Figure 7:
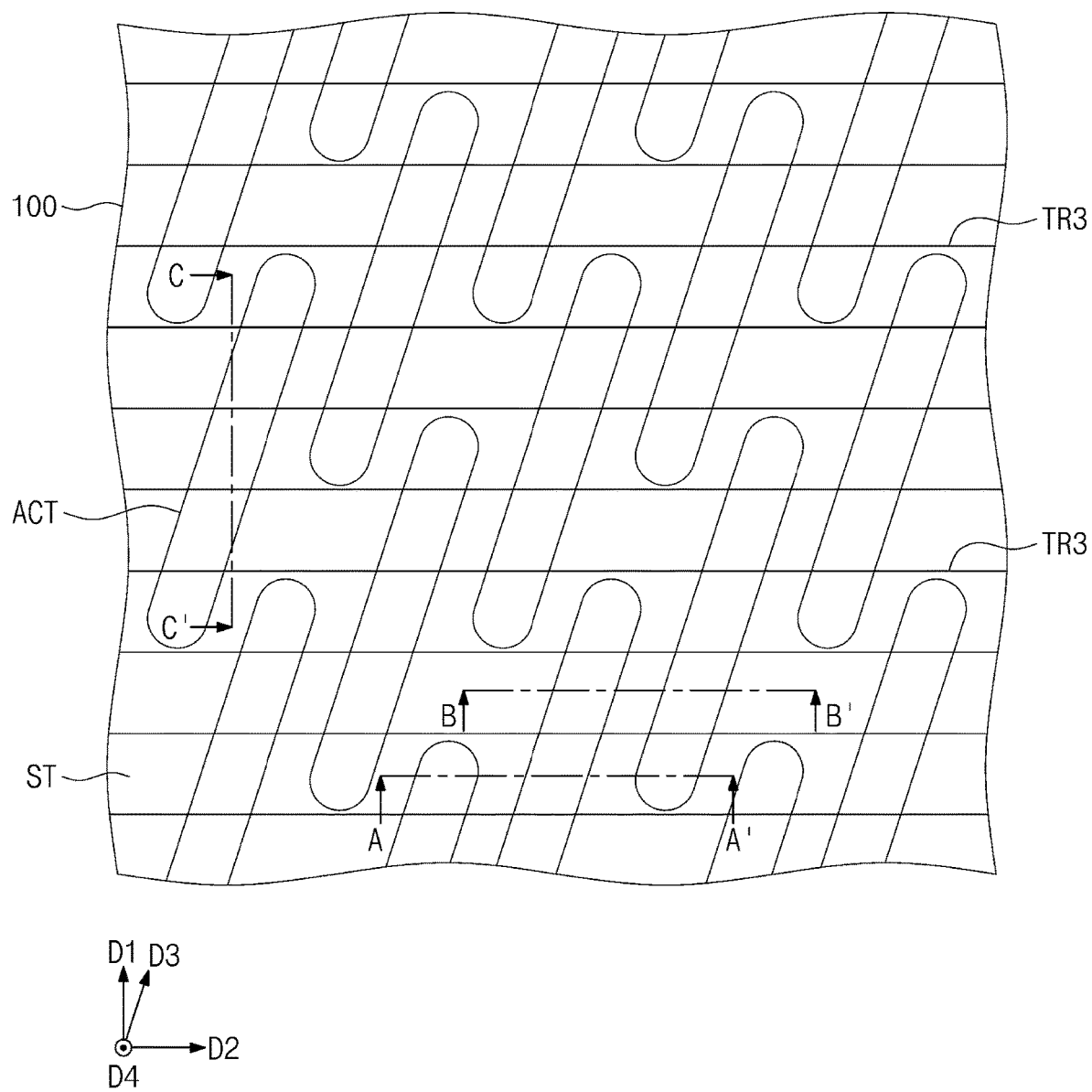
Figure 19A:
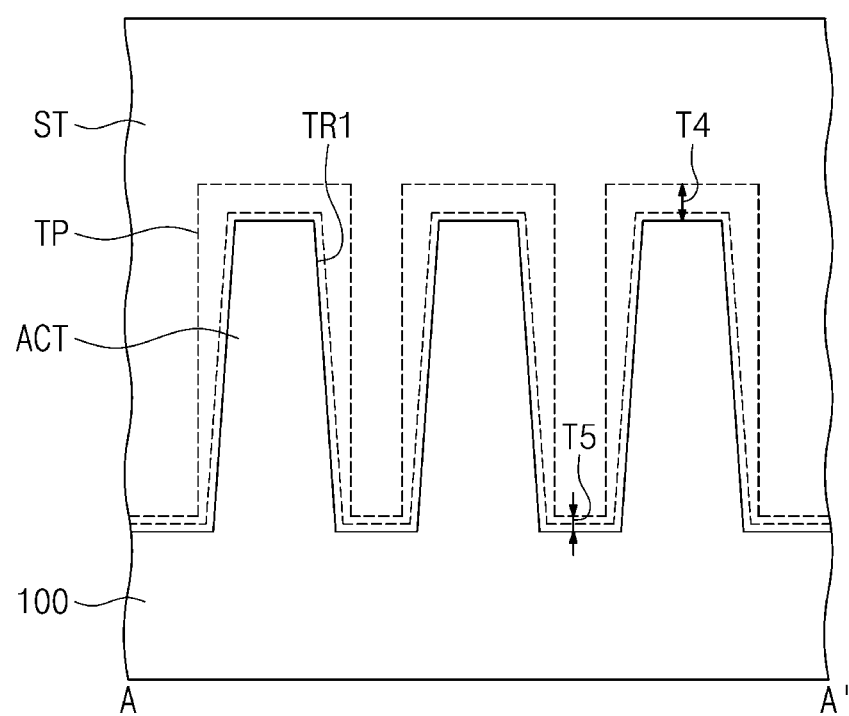
FIGS. 19A, 19B and 19C are cross-sectional views taken along the lines A-A', B-B' and C-C' of FIG. 5, respectively, to illustrate a method for manufacturing a semiconductor device according to example embodiments.
Figure 19B:
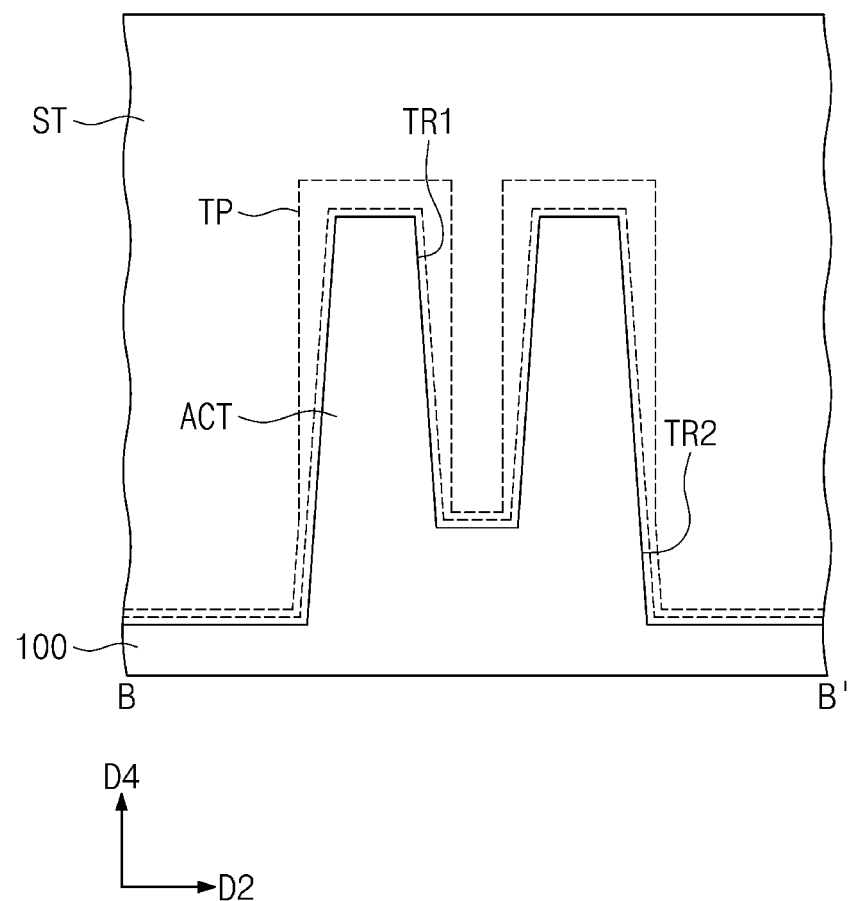
Figure 19C:
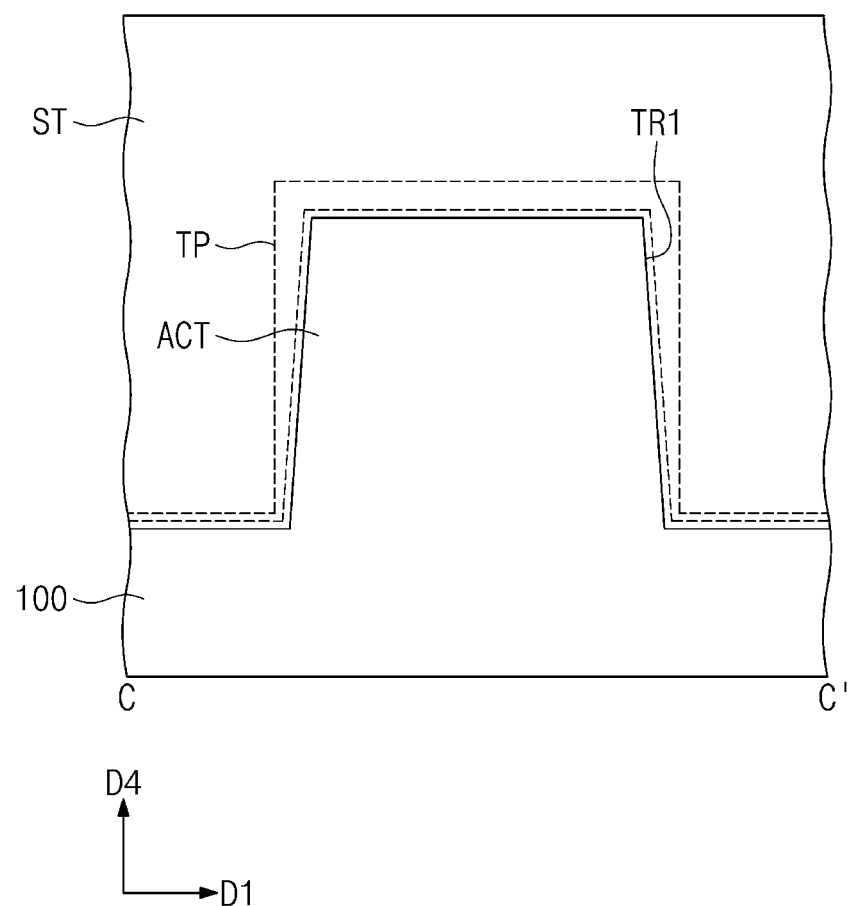

FIGS. 19A, 19B and 19C are cross-sectional views taken along the lines A-A', B-B' and C-C' of FIG. 5, respectively, to illustrate a method for manufacturing a semiconductor device according to example embodiments. In the present embodiments, the descriptions to the same technical features as in the above embodiments of FIGS. 1 to 16C will be omitted or mentioned briefly for the purpose of ease and convenience in explanation. In other words, differences between the present embodiments and the above embodiments of FIGS. 1 to 16C will be mainly described hereinafter.

Referring to FIGS. 5 and 19A to 19C, a device isolation layer ST may be formed on the resultant structure of FIGS. 3 and 4A to 4C. The device isolation layer ST may be formed by performing a semiconductor oxidation process. The semiconductor layer TP may be completely oxidized in the semiconductor oxidation process. A portion of the active pattern ACT may be additionally oxidized after the complete oxidation of the semiconductor layer TP in the semiconductor oxidation process.

For example, during the semiconductor oxidation process, a semiconductor material may be reduced by a fourth thickness T4 from a top surface of the semiconductor layer TP disposed on the top surface of the active pattern ACT. During the semiconductor oxidation process, a semiconductor material may be reduced by a fifth thickness T5 from a top surface of the semiconductor layer TP disposed on the bottom of the first trench TR1. The fourth thickness T4 may be greater than the first thickness T1 of the semiconductor layer TP of FIGS. 3 and 4A to 4C. The fifth thickness T5 may be greater than the second thickness T2 of the semiconductor layer TP of FIGS. 3 and 4A to 4C.

As a result, a size of each of the active patterns ACT after the semiconductor oxidation process may be smaller than a size of each of the active patterns ACT of FIGS. 1 and 2A to 2C. Subsequent processes may be substantially the same as described above with reference to FIGS. 7 to 16C.

Figure 15:
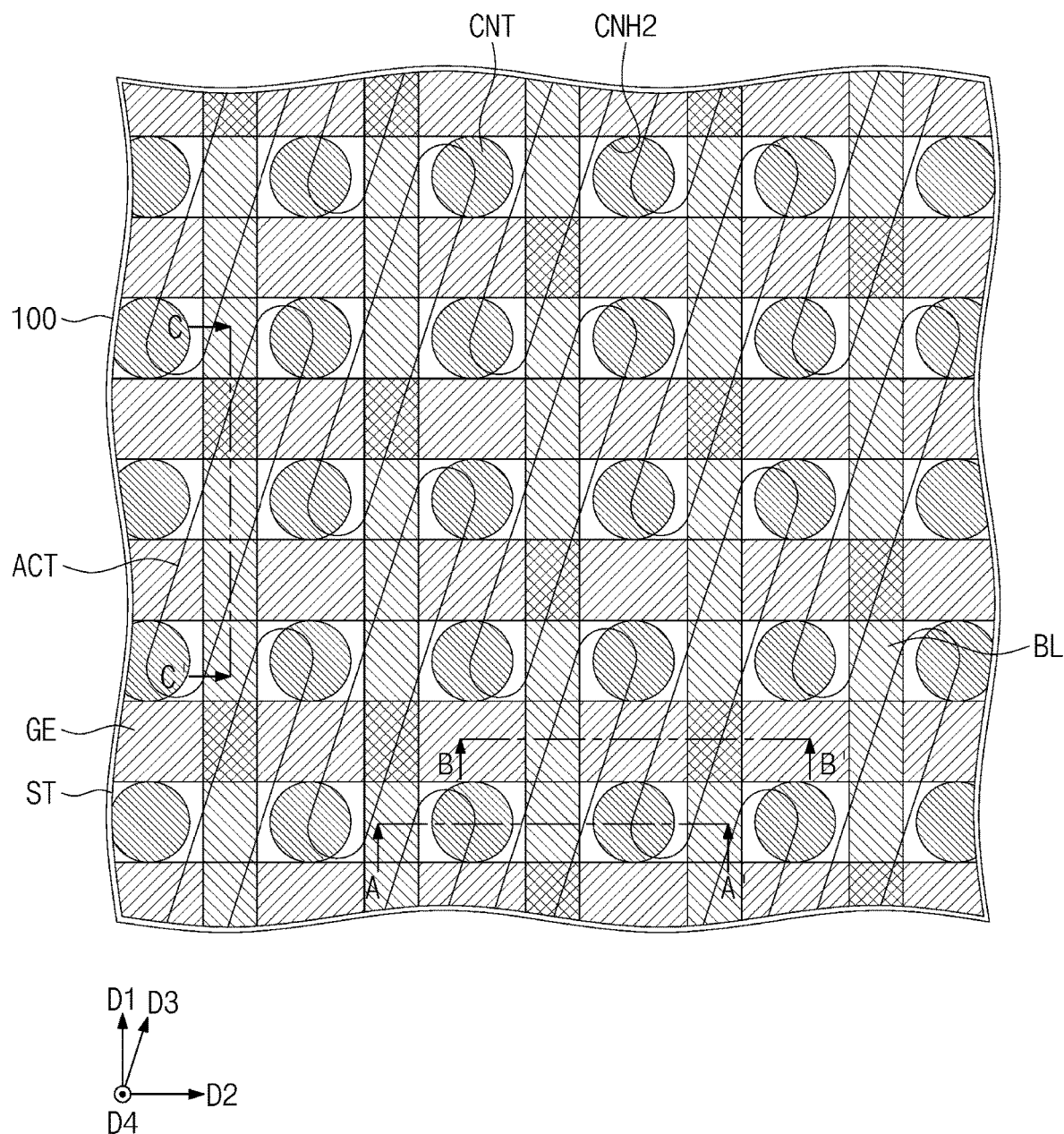
Figure 16A:
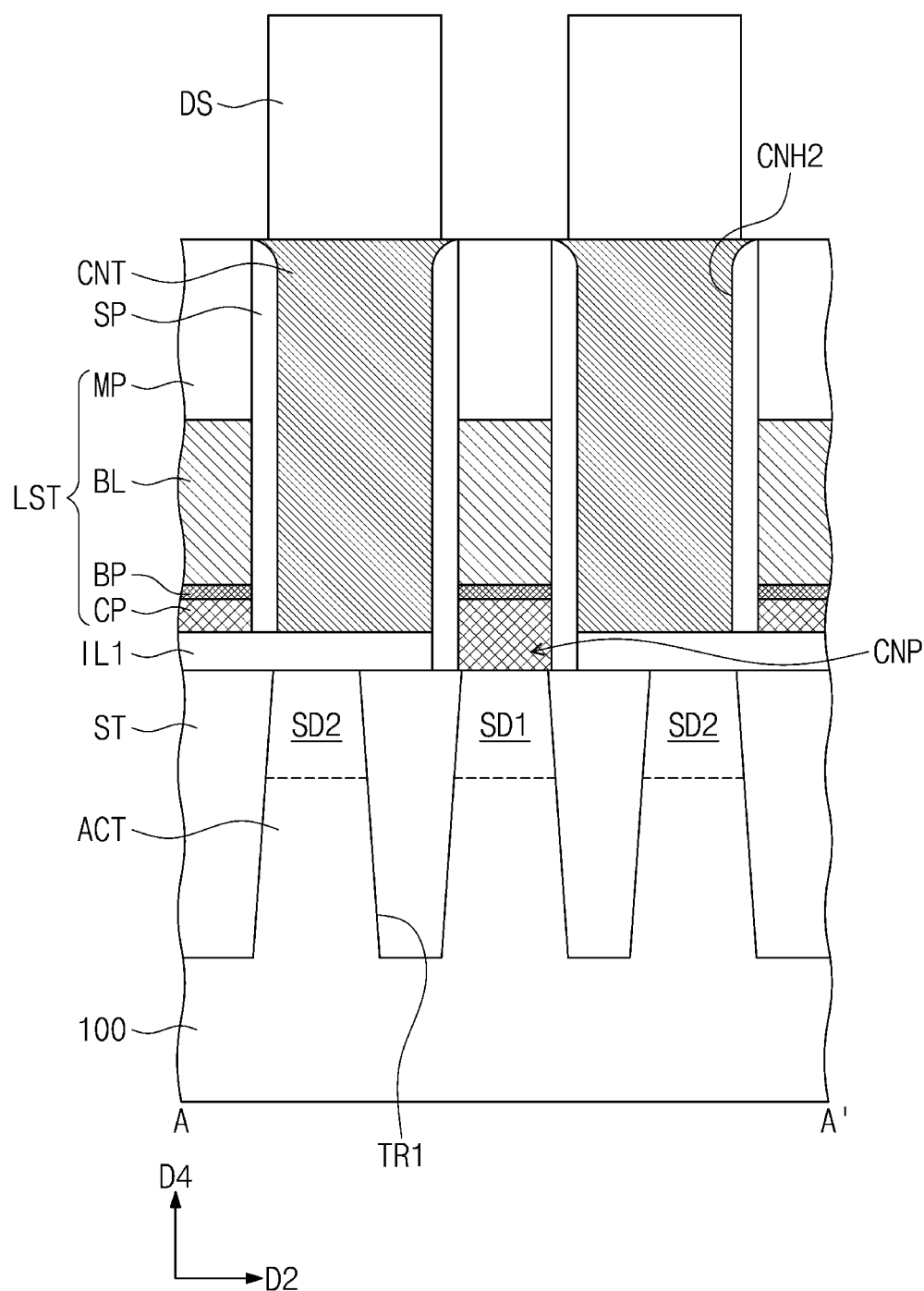
Figure 16B:
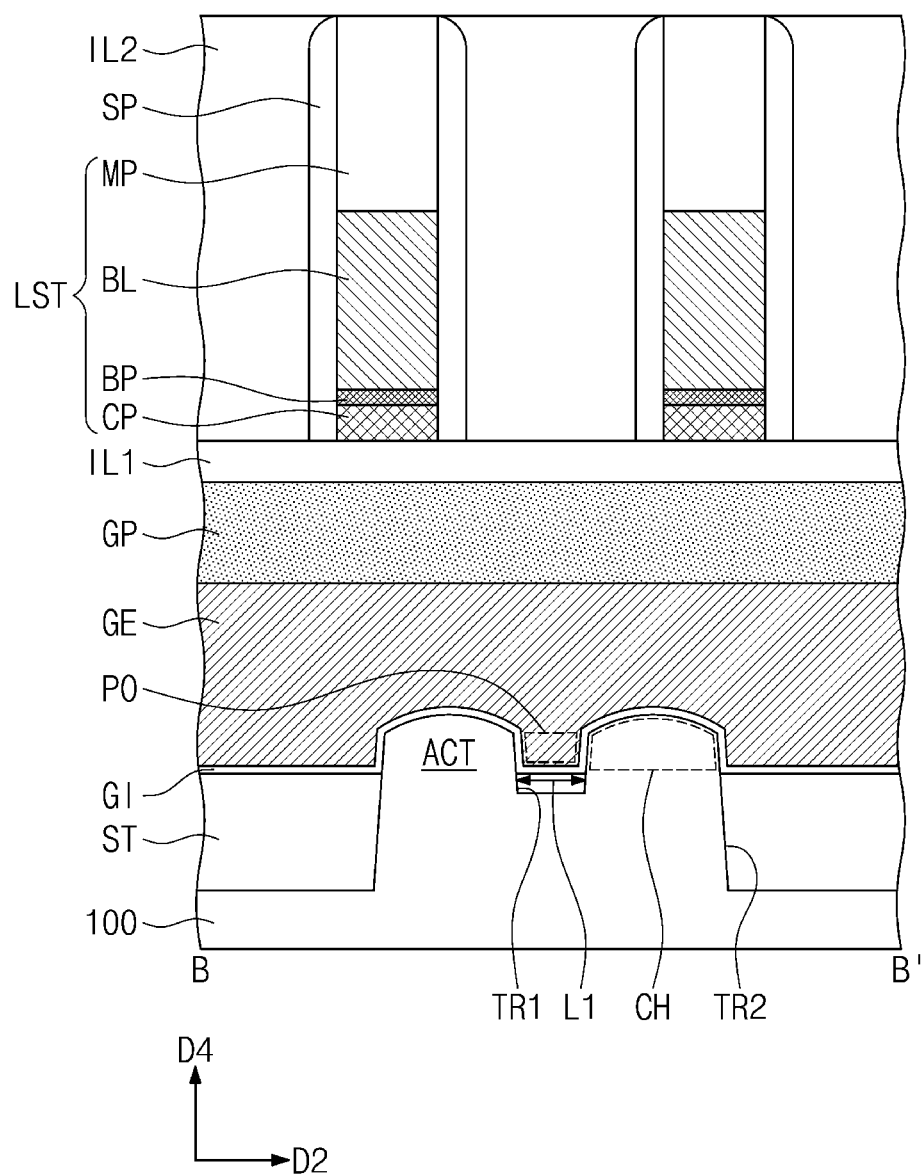
Figure 16C:
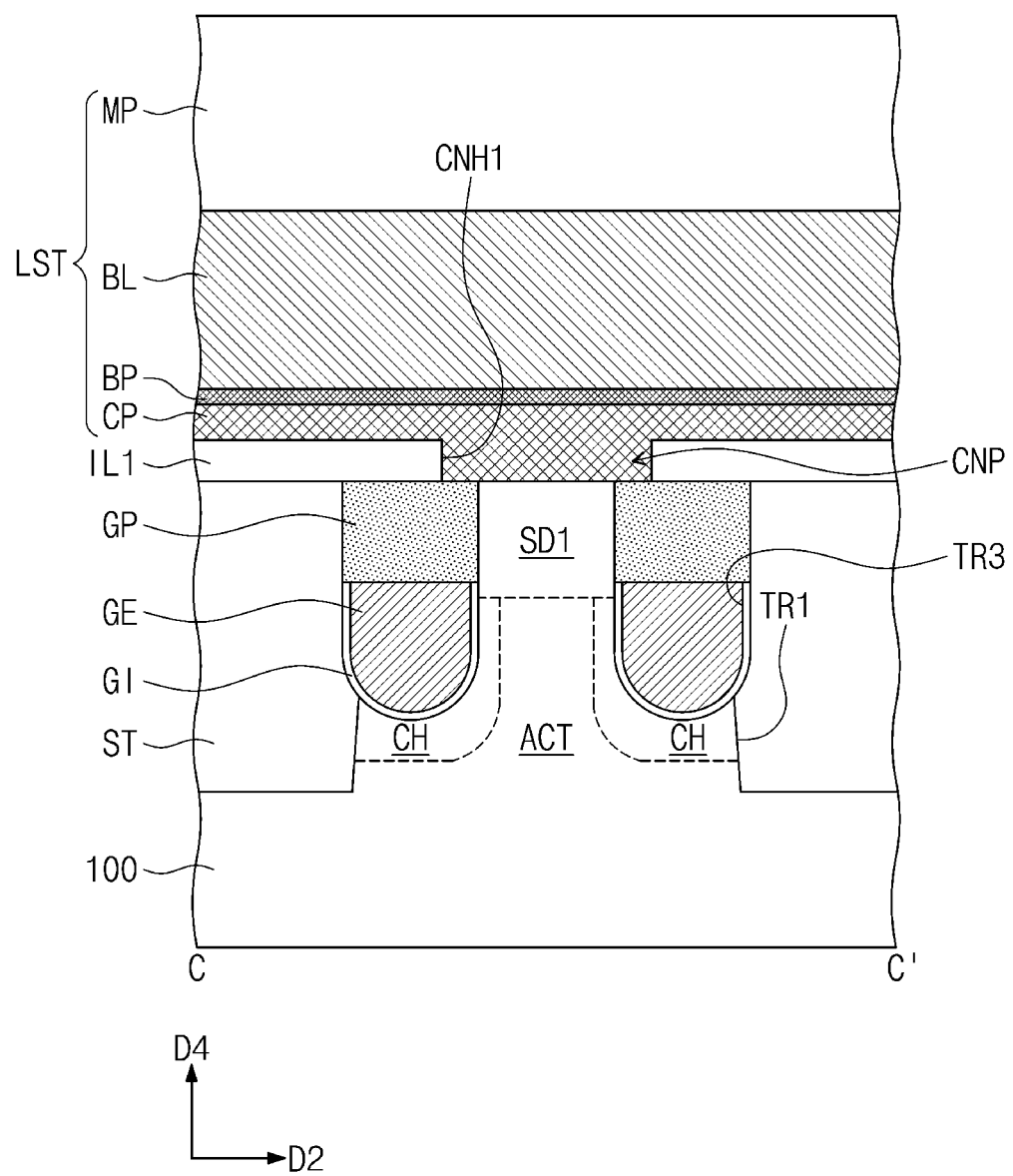
Figure 20:
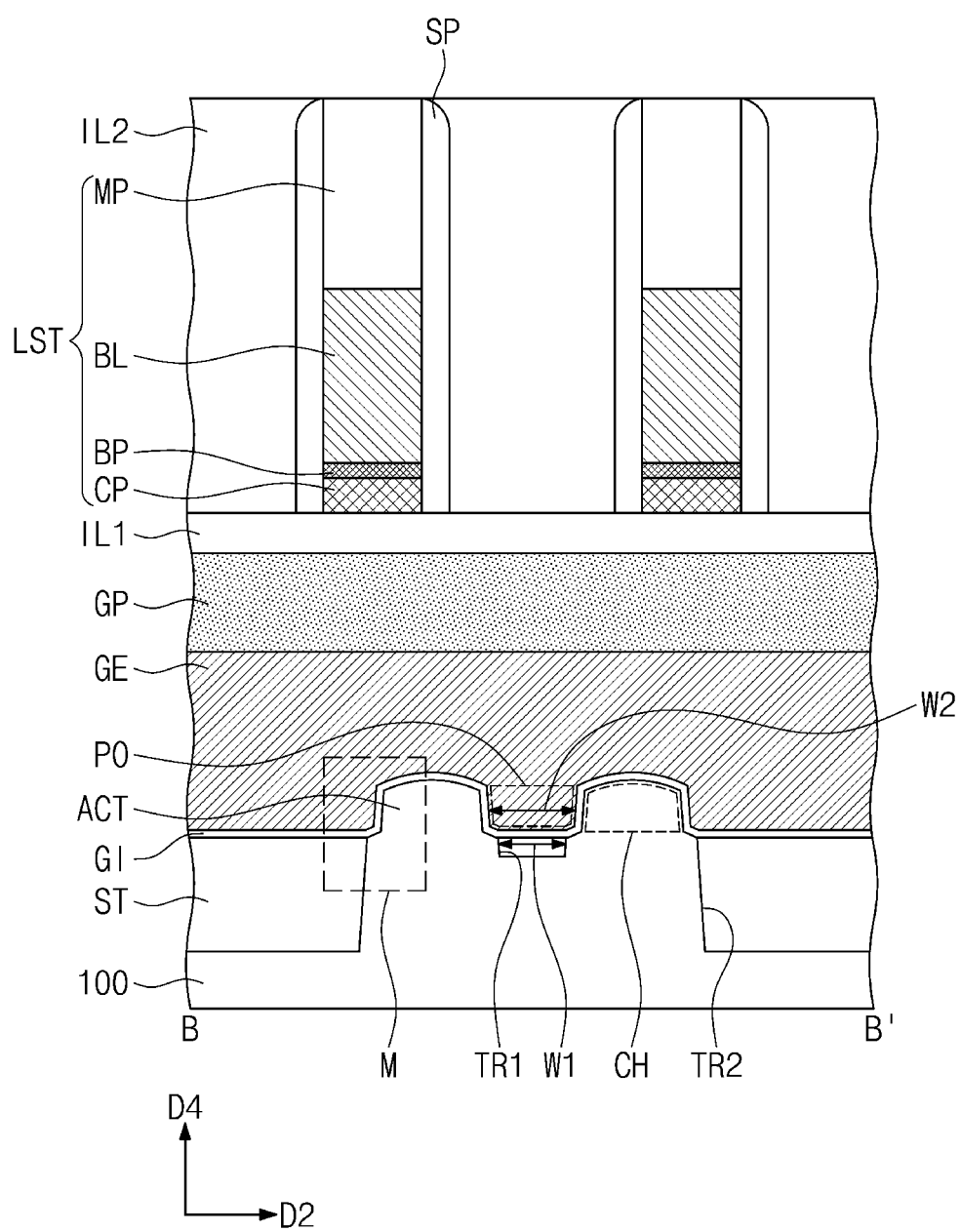
FIG. 20 is a cross-sectional view taken along the line B-B' of FIG. 15 to illustrate a semiconductor device according to example embodiments.
Figure 21:
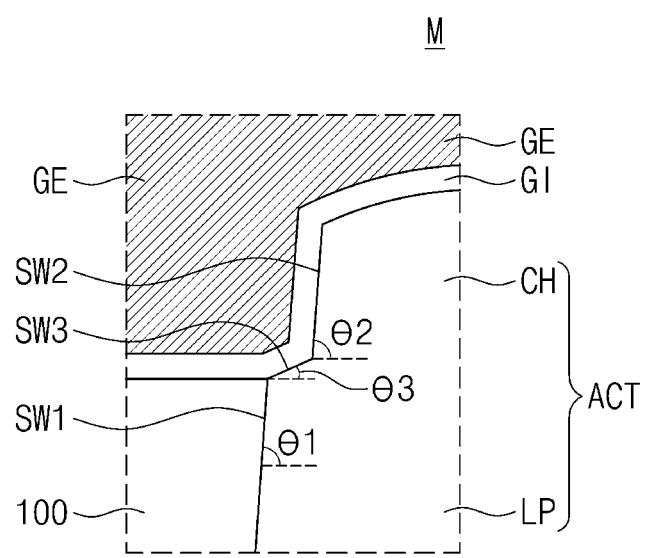
FIG. 21 is an enlarged cross-sectional view of a region 'M' of FIG. 20.

FIG. 20 is a cross-sectional view taken along the line B-B' of FIG. 15 to illustrate a semiconductor device according to example embodiments. FIG. 21 is an enlarged cross-sectional view of a region 'M' of FIG. 20. In the present embodiments, the descriptions to the same technical features as in the embodiments of FIGS. 15 and 16A to 16C will be omitted for the purpose of ease and convenience in explanation. In other words, differences between the present embodiments and the embodiments of FIGS. 15 and 16A to 16C will be mainly described hereinafter.

Referring to FIGS. 15, 16A, 16C, 20 and 21, a lower portion LP of an active pattern ACT may have a first sidewall SW1 covered or surrounded by the device isolation layer ST. A channel region CH of the active pattern ACT may have a second sidewall SW2 covered or surrounded by the gate dielectric layer GI and the gate electrode GE. The active pattern ACT may further have a third sidewall SW3 connecting the first sidewall SW1 and the second sidewall SW2. The third sidewall SW3 may be gentler than the first sidewall SW1 and may be gentler than the second sidewall SW2.

In more detail, the first sidewall SW1 may make a first angle $\theta 1$ with the bottom surface of the substrate 100, the second sidewall SW2 may make a second angle $\theta 2$ with the bottom surface of the substrate 100, and the third sidewall SW3 may make a third angle $\theta 3$ with the bottom surface of the substrate 100. Here, the first angle $\theta 1$ may be greater than the third angle $\theta 3$, and the second angle $\theta 2$ may be greater than the third angle $\theta 3$.

As a result, a width of the active pattern ACT in the second direction D2 may be significantly reduced from the lower portion LP of the active pattern ACT toward the channel region CH of the active pattern ACT.

The device isolation layer ST filling the first trench TR1 under the gate electrode GE may have a first width W1 in the second direction D2. The portion PO of the gate electrode GE, which is disposed between a pair of the channel regions CH adjacent to each other in the second direction D2, may have a second width W2 in the second direction D2. The second width W2 may be greater than the first width W1.

According to the example embodiments, the width of the channel region CH may be greatly reduced compared to the width of the lower portion LP of the active pattern ACT, and thus the portion PO of the gate electrode GE may be easily formed between the pair of channel regions CH adjacent to each other. As a result, the gate electrode GE may surround the top surface and the both sidewalls of the channel region CH to improve electrical characteristics of a transistor including the gate electrode GE.

According to example embodiments, at least a portion of the gate electrode may be formed to be disposed between the channel regions of the active patterns adjacent to each other. Thus, it is possible to prevent a leakage current from being generated through a region of the active pattern adjacent to the gate electrode. Furthermore, a contact area between the active pattern ACT and the contact CNT may be sufficiently secured.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method of manufacturing a semiconductor device, the method comprising:
    patterning a semiconductor substrate to form a plurality of active patterns comprising two active patterns arranged in a first direction to be adjacent to each other and having a first trench therebetween;
    forming a semiconductor layer on the plurality of active patterns so that the semiconductor layer covers the plurality of active patterns;
    forming a device isolation layer on the semiconductor layer so that the device isolation layer covers the semiconductor layer, fills the first trench covered by the semiconductor layer, and the semiconductor layer is oxidized;
    patterning the device isolation layer and the plurality of active patterns so that a second trench intersecting the first trench is formed and the two active patterns protrudes from the device isolation layer in the second trench; and
    forming a gate electrode in the second trench,
    wherein the forming the semiconductor layer on the plurality of active patterns is performed such that a first thickness of the semiconductor layer covering a top surface of each of the two active patterns is greater than a second thickness of the semiconductor layer covering a bottom of the first trench.

2. The method of claim 1, wherein a ratio of the first thickness to the second thickness is set between 0.5 and 0.85.

3. The method of claim 1, wherein, by the patterning the semiconductor substrate, a third trench is formed between two active patterns adjacent to teach other and arranged in a second direction oblique to the first direction, and
    wherein the third trench is deeper than the first trench.

4. The method of claim 1, wherein the forming the semiconductor layer on the plurality of active patterns comprises:
    inserting a plurality of semiconductor substrates including the semiconductor substrate in a plurality of corresponding slots provided in a batch-type reaction chamber, respectively; and
    performing a chemical vapor deposition (CVD) process by injecting a source gas into the batch-type reaction chamber and exhausting the injected source gas from the batch-type reaction chamber,
    wherein the source gas comprises $Si_xH_{2x+2}$, x being an integer equal to or greater than 3.

5. The method of claim 4, wherein the source gas comprises trisilane, tetrasilane or pentasilane.

6. The method of claim 5, wherein the CVD process is performed at a pressure of about $1 \times 10^{-1}$ to about 1 Torr and a temperature of about 350° C. to about 600° C. at a flow rate of about 100 sccm to about 400 sccm.

7. The method of claim 4, wherein the performing the CVD process further comprises injecting another source gas into the batch-type reaction chamber to form a semiconductor nitride layer on the plurality of active patterns, prior to the injecting the source gas into the batch-type reaction chamber.

8. The method of claim 7, wherein the other source gas comprises aminosilane.

9. The method of claim 1, wherein the forming the semiconductor layer on the plurality of active patterns comprises:
    inserting the semiconductor substrate in a single-type reaction chamber, and depositing the semiconductor substrate on a susceptor;
    heating the semiconductor substrate on the SUS; and
    performing a chemical vapor deposition (CVD) process by injecting a source gas into the single-type reaction chamber and exhausting the injected source gas from the single-type reaction chamber,
    wherein the CVD process is performed at a pressure of about 10 Torr to about 200 Torr, a temperature of about 400° C. to about 600° C., and a flow rate of the source gas ranges from about 5 sccm to about 50 sccm.

10. The method of claim 9, wherein the source gas comprises $Si_xH_{2x+2}$, $SiCl_4$, $SiCl_6$, or $SiCl_2H_4$, 'x' being an integer equal to or greater than 1.

11. The method of claim 10, wherein the source gas comprises monosilane or disilane.

12. The method of claim 9, wherein hydrogen is injected together with the source gas in the single-type reaction chamber in the performing the CVD process.

13. The method of claim 9, wherein the performing the CVD process further comprises injecting another source gas comprising aminosilane into the single-type reaction chamber to form a semiconductor nitride layer on the plurality of active patterns, prior to the injecting the source gas into the single-type reaction chamber.

14. A method of manufacturing a semiconductor device, the method comprising:
    patterning a semiconductor substrate to form a plurality of active patterns and a first trench between two active patterns adjacent to each other and arranged in a first direction;
    forming a semiconductor layer on the plurality of active patterns to cover the plurality of active patterns such that a thickness of the semiconductor layer along an outer surface of each of the two active patterns diminishes in a downward direction from a top portion toward a bottom portion of each of the two active patterns;

forming a device isolation layer on the semiconductor layer to cover the semiconductor layer and the plurality of active patterns, fill the first trench, and oxidize at least the semiconductor layer;

patterning the device isolation layer and the plurality of active patterns to form a second trench intersecting the first trench, and provide the two active patterns protruding from the device isolation layer in the second trench; and forming gate electrode in the second trench, wherein, after the oxidizing the at least the semiconductor layer, substantially all of the semiconductor layer is oxidized at least at a lower part of each of the two active patterns so that a space for a portion of the gate electrode to be filled between the two active patterns is provided in the first trench after the patterning the device isolation layer and the plurality of active patterns.

15. The method of claim 14, wherein, after the oxidizing the at least the semiconductor layer, at least a portion of each of the plurality of active patterns is oxidized.

16. The method of claim 14, wherein after the oxidizing the at least the semiconductor layer, the semiconductor layer is entirely oxidized.

17. The method of claim 14, wherein no portion of the plurality of active patterns is oxidized by the forming the device isolation layer on the semiconductor layer.

18. The method of claim 14, wherein after the oxidizing the at least the semiconductor layer, an oxidization layer is formed on the two active patterns, and wherein a thickness of the oxidization layer formed on an upper surface of each of the two active patterns is thicker than a thickness of the semiconductor layer formed on the upper surface of each of the two active patterns before the device isolation layer is formed on the semiconductor layer.

19. The method of claim 14, wherein the forming the semiconductor layer on the plurality of active patterns comprises:

inserting two or more of the semiconductor substrates in corresponding slots provided in a batch-type reaction chamber, respectively; and performing a chemical vapor deposition (CVD) process by injecting a source gas into the batch-type reaction chamber and exhausting the injected source gas from the batch-type reaction chamber, wherein, the source gas comprises $Si_xH_{2x+2}$, x being an integer equal to or greater than 3.

20. The method of claim 14, wherein the forming the semiconductor layer on the plurality of active patterns comprises:

inserting the semiconductor substrate in a single-type reaction chamber, and depositing the semiconductor substrate on a susceptor;

heating the semiconductor substrate on the susceptor; and performing a chemical vapor deposition (CVD) process by injecting a source gas into the single-type reaction chamber and exhausting the injected source gas from the single-type reaction chamber, wherein the CVD process is performed at a pressure of about 10 Torr to about 200 Torr, a temperature of about 400° C. to about 600° C., and a flow rate of the source gas ranges from about 5 sccm to about 50 sccm.

* * * * *